US006841330B2

(12) United States Patent
Miyake et al.

(10) Patent No.: US 6,841,330 B2
(45) Date of Patent: Jan. 11, 2005

(54) PLANOGRAPHIC PRINTING PLATE PRECURSOR

(75) Inventors: Hideo Miyake, Shizuoka-ken (JP); Akio Oda, Shizuoka-ken (JP); Tomoyoshi Mitsumoto, Shizuoka-ken (JP); Kaoru Iwato, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/996,892

(22) Filed: Nov. 30, 2001

(65) Prior Publication Data

US 2002/0136979 A1 Sep. 26, 2002

(30) Foreign Application Priority Data

Nov. 30, 2000 (JP) ....................................... 2000-365786
Feb. 6, 2001 (JP) ....................................... 2001-029890

(51) Int. Cl.[7] ................................................ G03F 7/023

(52) U.S. Cl. ....................... 430/156; 430/165; 430/166; 430/191; 430/192; 430/193; 430/270.1; 430/271.1; 430/273.1; 430/302

(58) Field of Search ................................. 430/156, 165, 430/166, 271.1, 273.1, 302, 270.1, 191, 192, 193

(56) References Cited

U.S. PATENT DOCUMENTS 4,696,891 A * 9/1987 Guzzi ......................... 430/325
4,792,516 A * 12/1988 Toriumi et al. ............. 430/196
5,525,453 A * 6/1996 Przybilla et al. ............ 430/170
5,731,123 A * 3/1998 Kawamura et al. ......... 430/176
6,060,217 A * 5/2000 Nguyen et al. ............. 430/302
6,083,663 A * 7/2000 Vermeersch et al. ........ 430/302
6,117,610 A * 9/2000 Sheriff et al. ............... 430/190
6,153,353 A * 11/2000 Van Damme et al. ... 430/270.1
6,352,811 B1 * 3/2002 Patel et al. .............. 430/270.1

FOREIGN PATENT DOCUMENTS

EP 0 908 307 A2 4/1999
EP 908307a1 * 4/1999
EP 0 997 272 A1 5/2000
EP 997272a2 * 5/2000

* cited by examiner

*Primary Examiner*—John S. Chu
(74) *Attorney, Agent, or Firm*—Burns, Doane, Swecker & Mathis, L.L.P.

(57) ABSTRACT

A positive planographic printing plate precursor comprising a recording layer containing a water-insoluble and alkali-soluble resin, an infrared absorbent and an organic quaternary ammonium salt. A positive planographic printing plate precursor comprising at least two recording layers containing the resin and the infrared absorbent with a coating amount of an upper positive recording layer being in the range of 0.05 to 0.45 g/m$^2$.

19 Claims, No Drawings

PLANOGRAPHIC PRINTING PLATE PRECURSOR

BACKGROUND OF THE INVENTION

1. Field of the Invention

The present invention relates to an image recording material which can be used as an offset printing master. More particularly, the present invention relates to a positive planographic printing plate precursor for use in direct plate formation with an infrared laser, in which an image of the plate can be formed directly by exposing the plate to an infrared laser on the basis of digital signals from a computer or the equivalent.

2. Description of the Related Art

The development of lasers in recent years has been remarkable. In particular, high-output, compact solid-state lasers and semiconductor lasers having an emission area from near infrared to infrared have become readily available. These lasers are very useful as exposure light sources when making a plate directly from digital data from a computer or the like.

Positive planographic printing plate material for exposure to an infrared laser contains a binder resin that is soluble in an aqueous alkali solution, an infrared(IR) dye that absorbs light to generate heat and the like as an essential component. At unexposed portions (image portions), the IR dye and the like serve as a dissolution inhibitor to substantially reduce the solubility of the binder resin by interacting with the binder resin. At exposed portions (non-image portions), the interaction between the IR dye and the like and the binder resin is weakened by the generated heat, wherein the exposed portions are dissolved in an alkali developer to form a planographic printing plate.

However, in such the positive planographic printing plate material, the difference under various conditions of use between resistance to solubility of the unexposed portions (image portions) in a developer and solubility of the exposed portions (non-image portions) in a developer is still insufficient, and there has been the problem that over development or under development is easily caused by variations in conditions of use. In addition, the surface of the planographic printing plate is easily compromised by fine scratches generated by the surface of the planographic printing plate being contacted during handling. Thus, there has been the problem that, even when the surface of the planographic printing plate is only slightly compromised by such fine scratches, solubility of compromised non-exposed portions (image portions) is increased, whereby the non-exposed portions are dissolved at the time of development, scars are left on the surface. That is, printability deteriorates, ink does not properly adhere to the surface of the planographic printing plate, and the appearance of obtained images deteriorates. Moreover, there is an additional drawback in that, because there is the potential for the scarred areas of the surface to reduce performance, it becomes necessary to conduct a re-exposure or prepare another plate precursor and to expose it, whereby labor is needlessly expended.

Such problems are derived from an essential difference in the mechanism by which a plate is made by exposing a positive planographic printing plate material to an infrared laser and the mechanism by which a plate is made by exposing a positive planographic printing plate material to ultraviolet light. In the case of the latter, the positive planographic printing plate material includes as essential components a binder resin that is soluble in an aqueous alkali solution, and an onium salt, quinonediazide compounds or the like. The onium salt and the quinonediazide compounds not only function as dissolution inhibitors by inhibiting dissolution at unexposed portions (image portions) by interacting with the binder resin, but also function as dissolution accelerators by releasing acids upon being decomposed by light at exposed portions (non-image portions), thereby performing dual roles.

In contrast, the IR dye and the like in the positive planographic printing plate material for exposure to an infrared laser functions only to inhibit dissolution of the unexposed portions (image portions), and does not accelerate dissolution of the exposed portions (non-image portions). Therefore, in the positive planographic printing plate material for exposure to an infrared laser, in order to produce a difference in the solubilities of the unexposed portions and the exposed portions, it is necessary to use, as a binder resin, a resin having high solubility in an alkali developer in advance. These results in problems such as weakened resistance to scratches and unstability of the plate precursor before development.

Various strategies have been proposed to inhibit variance in developability caused by scratching of the unexposed portions (image portions), such as disposing a protective layer on a positive recording layer and increasing the thickness of the entire recording layer. However, when a protective layer that is high in film strength and has excellent resistance to scratches is disposed on the positive recording layer, there is the potential for developability to drop. Further, while increasing the thickness of the entire recording layer suppresses defects caused by scratches, there are problems in that sensitivity is reduced and there is a tendency for terminability (release ability) of the dissolution-inhibiting performance at deep portions of the recording layer to be reduced.

Although various dissolution inhibitors have been proposed to improve resistance to developability, few can rapidly terminate the inhibition effect by exposure to light. In order to enhance resistance to solubility of the unexposed portions (image portions) in a developer without reducing the developability of the exposed portions (non-image portions), European Patent No. 950517 discloses a method using a siloxene type surfactant, and Japanese Patent Application Laid-Open (JP-A) No. 10-26851 discloses a method in which sulfonic esters are used as dissolution inhibitors. Such methods may improve resistance to development of the image portions of the recording layer, but do not achieve a sufficient difference in the solubilities of the unexposed portions and the exposed portions to the extent that clear and better image can be formed regardless of variance in the activity of the developer.

SUMMARY OF THE INVENTION

An object of the present invention is to provide a positive planographic printing plate precursor that is exposed to an infrared laser in direct plate formation, with the plate precursor including a recording layer that can form excellent images, has excellent sensitivity and development latitude at the time an image is formed, and with which the generation of defects resulting from scratches on image portions is suppressed.

As a result of their intensive study, the present inventors found that a planographic printing plate having excellent development latitude can be obtained by incorporating an organic quaternary ammonium salt as a dissolution inhibitor in a layer which comprises a water-insoluble and alkali-soluble resin.

The present inventors also found that a planographic printing plate precursor that has high sensitivity, with which the influence of scratches is suppressed, and that can form excellent images free from defects, can be obtained by disposing on a support at least two recording layers including a light-heat converting agent, incorporating in both the upper and lower recording layers an infrared-absorbing dye, and controlling the coating amount of the layers in a predetermined range.

A first aspect of the present invention is a positive planographic printing plate precursor. The precursor comprises a support having disposed thereon a positive recording layer containing (A) a water-insoluble and alkali-soluble resin, (B) an infrared absorbent and (C) an organic quaternary ammonium salt, wherein solubility of the recording layer in an aqueous alkali solution is increased by exposure to an infrared laser.

As the (C) organic quaternary ammonium salt used herein, a salt having in a molecule thereof at least one group of an aryl group and a carbonyl group is preferable from the viewpoint of effects.

Although the mechanism resulting in the action of the present invention is not entirely clear, by incorporating the (A) water-insoluble and alkali-soluble resin (hereinafter, "alkali-soluble resin") and the (C) organic quaternary ammonium salt in the same recording layer, a dry film is formed in a state that is energetically stable (i.e., a state in which there has been interaction between both compounds). Because the effect of inhibiting dissolution into an alkaline solution can be obtained at unexposed portions by this interaction, excellent resistance to alkali development in the portions is manifested in comparison with a case in which the (A) alkali-soluble resin is used by itself. Furthermore, because the (C) organic quaternary ammonium salt has a chemical structure in which the nitrogen cation is complicatedly surrounded by groups and therefore the interaction between the (A) alkali-soluble resin and the (C) organic quaternary ammonium salt is relatively small, the interaction is effectively terminated (released) at regions where the (B) infrared absorbent has generated heat due to exposure to the infrared laser. In addition, since the (C) organic quaternary ammonium salt itself is a low-molecular compound, it is easily dispersed in an aqueous alkaline solution when the interaction has been terminated, and dissolution-accelerating properties can be obtained. For these reasons, it is surmised that using the (C) organic quaternary ammonium salt results in a large difference in the solubilities in an alkali developer of the unexposed portions and the exposed portions, whereby it is possible to obtain a better image regardless of variations of the concentration of the developer.

A second aspect of the present invention is a positive planographic printing plate precursor. The precursor comprises a support having disposed thereon at least two positive recording layers containing a water-insoluble and an alkali-soluble resin and an infrared-absorbing dye, with solubility of the recording layer in an aqueous alkali solution being increased by exposure to an infrared laser, wherein a coating amount of an upper positive recording layer is in the range of 0.05 to 0.45 $g/m^2$.

The positive recording layer having a coating amount in the range of 0.05 to 0.45 $g/m^2$ is preferably located nearest to the surface among a plurality of positive recording layers. For example, when two positive recording layers are disposed on the support, the upper positive recording layer is the one having a coating amount in the range of 0.05 to 0.45 $g/m^2$, and when three positive recording layers are disposed on the support, the uppermost positive recording layer is the one having a coating amount in the range of 0.05 to 0.45 $g/m^2$. The positive recording layer closest to the surface is referred to below as the upper(most) recording layer.

It is not entirely clear why sensitivity, development latitude and resistance of image portions to scratches are excellent in the positive planographic printing plate precursor of the second aspect. It is surmised that by coating on a support at least two positive recording layers including an infrared-absorbing dye, with the coating amount of the uppermost positive recording layer being 0.05 to 0.45 $g/m^2$, it becomes possible to prevent scratches from being generated on the surface and to minimize the impact exerted upon all the recording layers, particularly the lower recording layer(s), by fine scratches on the upper recording layer. Moreover, by making the upper recording layer thin and incorporating therein an infrared-absorbing dye, sensitivity to recording can be increased, and by also incorporating an infrared-absorbing dye in the lower recording layer(s), the effect of improving development latitude is obtained. In addition, although the reason therefor is not entirely clear, it has been confirmed that resistance to development of image portions in high-concentration developer is improved.

DESCRIPTION OF THE PREFERRED EMBODIMENTS

The first aspect of the present invention will be described in detail below.

A planographic printing plate precursor of the first aspect of the present invention contains (A) a water-insoluble and alkali-soluble resin, (B) an infrared absorbent and (C) an organic quaternary salt in a recording layer. Components comprised in the recording layer will be explained below.

[(C) Organic Quaternary Ammonium Salt]

The (C) organic quaternary ammonium salt used in a present invention is not particularly limited. Known quaternary ammonium salt having organic groups can be appropriately selected and used. A low-molecular compound, monomer or oligomer is suitable as the (C) organic quaternary ammonium salt used in the present invention. Among them, a quaternary ammonium salt having in a molecule thereof at least one of an aryl group and a carbonyl group as an organic group is preferable from the viewpoint of the effects. Further, a quaternary ammonium salt having in a molecule both an aryl group and a carbonyl group is more preferable as the (C) organic quaternary ammonium salt.

Examples of the organic quaternary ammonium salt compound, which is suitably used in the present invention, include a compound represented by the following general formula (I).

General formula (I)

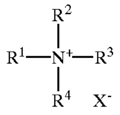

In the formula, $R^1$, $R^2$, $R^3$ and $R^4$ are each independently an organic group having one or more carbon atoms, or they may be bonded with each other to form a ring.

Preferable examples of the organic quaternary ammonium salt compound represented by the general formula (I) include a compound wherein at least one of $R^1$, $R^2$, $R^3$ and $R^4$ is a functional group having a partial structural unit (structures) shown below.

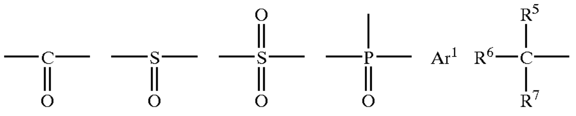

In the units, $AR^1$ represents an aryl group, $R^5$, $R^6$ and $R^7$ represent independently a hydrogen atom or an organic group having one or more carbon atoms, at least two of $R^5$, $R^6$ and $R^7$ are not a hydrogen atom, and $R^5$, $R^6$ and $R^7$ may be bonded with each other to form a ring.

Another suitable examples of the organic quaternary ammonium salt compound represented by the general formula (I) include a compound wherein at least one of $R^1$, $R^2$, $R^3$ and $R^4$ is selected from the group consisting of functional groups (structures) shown below (referred to a group A).

Group A

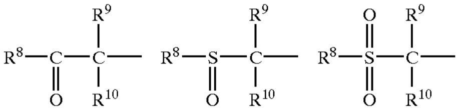

In the formulas, $R^8$, $R^9$ and $R^{10}$ represent independently a hydrogen atom or an organic group having one or more carbon atoms, at least two of $R^8$, $R^9$ and $R^{10}$ are selected from an organic group which is not a hydrogen atom, that is, these are not a hydrogen atom, and $R^8$, $R^9$ and $R^{10}$ may be bonded with each other to form a ring.

More preferable examples of the organic quaternary ammonium salt compounds represented by the general formula (I) include a compound wherein at least one of $R^1$, $R^2$, $R^3$ and $R^4$ is selected from the group consisting of functional groups (structures) shown below (referred to a group B).

Group B

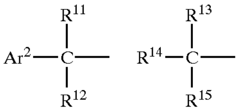

In the formulas, $Ar^2$ represents an aryl group, $R^{11}$ and $R^{12}$ represent independently a hydrogen atom or an organic group having one or more carbon atoms, and $Ar^2$, $R^{11}$ and $R^{12}$ may be bonded with each other to form a ring. $R^{13}$, $R^{14}$ and $R^{15}$ represent independently a hydrogen atom or an organic group having one or more carbon atoms, and at least one of $R^{13}$, $R^{14}$ and $R^{15}$ is a non-aromatic cyclic substituent, or adjacent two groups of $R^{13}$, $R^{14}$ and $R^{15}$ may be bonded with each other to form a ring.

Most preferable examples of the organic quaternary ammonium salt compound represented by the general formula (I) include a compound wherein $R^8$ in the functional groups of the group A is an aryl group and a compound wherein at least two of $R^1$, $R^2$, $R^3$ and $R^4$ are selected from the groups A and B. Among them, a compound which comprises at least one group selected from the group A and at least one group selected from the group B is most preferable.

Concrete examples of the preferable organic quaternary ammonium salt which can be used in the present invention are shown below, however, these are not intended to limit the present invention.

Ammonium salt (1)

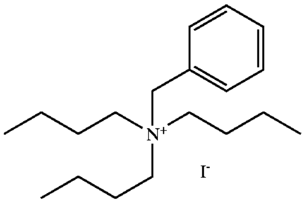

Ammonium salt (2)

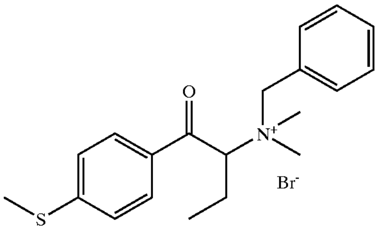

Ammonium salt (3)

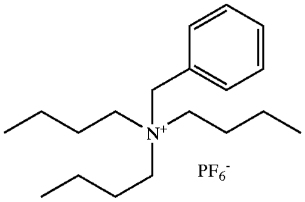

Ammonium salt (4)

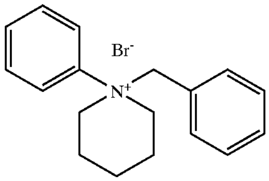

Ammonium salt (5)

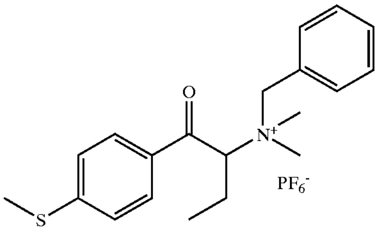

Ammonium salt (6)

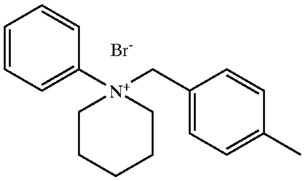

Ammonium salt (7)

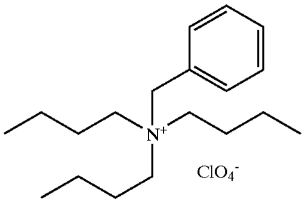

Ammonium salt (8)

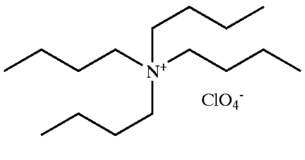

-continued

Ammonium salt (9)

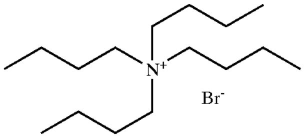

Ammonium salt (10)

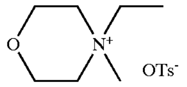

It is preferable that the (C) organic quaternary ammonium salt is contained at 0.1 to 40% by weight, preferably 0.5 to 10% by weight of the total solid component of the positive recording layer. When the content of the (C) organic quaternary ammonium salt is too small such that the (C) organic quaternary ammonium salt is contained in an amount of less than 0.1% by weight, it is difficult to obtain the effects of the present invention. When the content is too large, the content of an alkali-soluble resin to be used in combination with the (C) organic quaternary ammonium salt is relatively reduced and, thus, there is a possibility that abrasion resistance during printing is lowered.

[(A) Water-insoluble and Alkali-soluble Resin]

The water-insoluble and alkali-soluble resin used in the present invention is not particularly limited as long as it has been already known and utilized. However, a polymer compound having in a molecule at least one of (1) a phenolic hydroxy group, (2) a sulfonamide group and (3) an active imide group is preferable as the resin. As concrete examples of the alkali-soluble polymer, which can be suitably used in the present invention, examples are shown below, however, they are not intended to limit the alkali-soluble polymers.

(1) Resin having a Phenolic Hydroxyl Group

Examples of the resin having a phenolic hydroxyl group include novolac resins such as phenol/formaldehyde resins, m-cresol/formaldehyde resins, p-cresol/formaldehyde resins, m-cresol/p-cresol/formaldehyde resins, 2,5-xylenol/formaldehyde resins, 3,5-xylenol/formaldehyde resins, phenol/cresol (this cresol may be m-cresol, p-cresol or a mixture of m-cresol and p-cresol) formaldehyde resins, phenol/xylenol formaldehyde resins, xylenol/cresol (this cresol may be m-cresol, p-cresol or a mixture of m-cresol and p-cresol) formaldehyde resins and phenol/cresol/xylenol formaldehyde resins, and pyrogallol/acetone resins.

Further, resins described in U.S. Pat. No. 4,123,279 wherein resins such as t-butylphenol formaldehyde resin and octylphenol formaldehyde resin are obtained by a condensation polymerization reaction between a formaldehyde and a phenol having as a substituent an alkyl group containing 3 to 8 carbon atoms, can be used.

Preferable examples of the polymer compound having a phenolic hydroxyl group include a polymer compound having at least one of phenolic hydroxyl group on a side chain thereof. Examples of the polymer compound having at least one of phenolic hydroxyl group on a side chain include a polymer compound which is obtained by monopolymerization of a polymerizable monomer of a low-molecular compound having one or more phenolic hydroxyl groups and one or more polymerizable unsaturated bonds, and a polymer compound which is obtained by copolymerization of the polymerizable monomer and another polymerizable monomer.

Examples of the polymerizable monomer having a phenolic hydroxyl group include acrylamide, methacrylamide, acrylic ester, methacrylic ester, hydroxystyrene and the like, each having at least one of phenolic hydroxyl group.

Concrete examples of the monomer include N-(2-hydroxylphenyl)acrylamide, N-(3-hydroxylphenyl)acrylamide, N-(4-hydroxylphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate and 2-(4-hydroxyphenyl)ethyl methacrylate can be appropriately used. Such the resins having at least one of phenolic hydroxyl group may be used singly or in combinations of two or more.

(2) Alkali-soluble Resin having a Sulfonamide Group

Examples of an alkali-soluble resin having a sulfonamide group include polymer compounds obtained by monopolymerization of a polymerizable monomer having at least one of sulfonamide group, or copolymerizing the polymerizable monomer and another polymerizing monomer. Examples of the polymerizable monomer having a sulfonamide group include polymerizable monomers of a low-molecular compound having one or more sulfonamide groups —NH—$SO_2$— in which at least one hydrogen atom is bound to a nitrogen atom, and one or more polymerizable unsaturated bonds. Among them, low-molecular compounds having acryloyl groups, aryl groups or vinyloxy groups, and having substituted or mono-substituted aminosulfonyl groups or substituted sulfonylimino groups are preferable. Examples of such the compounds include compounds represented by following general formulas (a) to (e).

General formula (a)

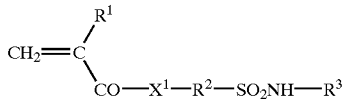

General formula (b)

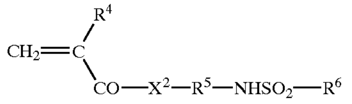

General formula (c)

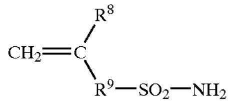

General formula (d)

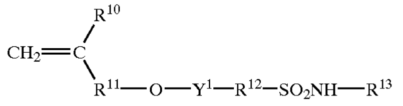

General formula (e)

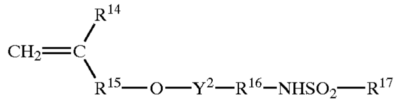

In the formulas, $X^1$ and $X^2$ each represent —O— or —$NR_7$—, $R^1$ and $R^4$ each represent a hydrogen atom or —$CH_3$ $R^2$, $R^5$, $R^9$, $R^{12}$ and $R^{16}$ each represent an alkylene group having 1 to 12 carbon atoms, a cycloalkylene group, an arylene group or an aralkylene group, each optionally may be substituted. $R^3$, $R^7$ and $R^{13}$ represent a hydrogen atom, an alkyl group having 1 to 12 carbon atoms, a cycloalkyl group, an aryl group or an aralkyl group, each optionally may be substituted. $R^6$ and $R^{17}$ represent an alkyl group having 1 to 12 carbon atoms, a cycloalkyl group, an aryl group or an aralkyl group, each optionally may be substituted. $R^8$, $R^{10}$ and $R^{14}$ represent a hydrogen atom or $—CH_3—$. $R^{11}$ and $R^{15}$ each represent a single bond or an alkylene group having 1 to 12 carbon atoms, a cycloalkylene group, an arylene group or an aralkylene group, each optionally may have a substituent. $Y^1$ and $Y^2$ each represent a single bond or —CO—. Concrete examples of the compound include m-aminosulfonylphenyl methacrylate, N-(p-aminosulfonylphenyl)methacrylamide and N-(p-aminosulfonylphenyl)acrylamide which can be appropriately used.

(3) Alkali-soluble Resin having an Active Imide Group

An alkali-soluble resin having an active imide group has in a molecule preferably an active imide group represented by the following formula. Examples of this polymer compound include polymer compounds obtained by polymerization of a polymerizable monomer of a low-molecular compound having in a molecule one or more active imide groups represented by the following formula and one or more polymerizable unsaturated bonds, or by copolymerization of the polymerizable monomer with another polymerizable monomer.

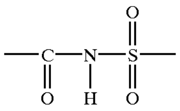

Concrete examples of the compound include N-(p-toluenesulfonyl)methacrylamide, N-(p-toluenesulfonyl)acrylamide.

As the alkali-soluble resin of the present invention, a novolac resin is preferable.

Preferable examples of the alkali-soluble resin also include polymer compounds obtained by polymerization of two or more polymerizable monomers selected from the group consisting of the polymerizable monomer having a phenolic hydroxyl group, the polymerizable monomer having a sulfonamide group and the polymerizable monomer having an active imide group, and polymer compounds obtained by copolymerization of two or more polymerizable monomers and another polymerizable monomer. When the polymerizable monomer having a phenolic hydroxyl group is copolymerized with the polymerizable monomer having a sulfonamide group and/or the polymerizable monomer having an active imide group, the blending weight ratio thereof is in the range of from 50:50 to 5:95, and preferably in the range of from 40:60 to 10:90.

When the alkali-soluble resin of the present invention is a polymer compound which is obtained by copolymerization of another polymerizable monomer and at least one monomer selected from the group consisting of the polymerizable monomer having a phenolic hydroxyl group, the polymerizable monomer having a sulfonamide group and the polymerizable monomer having an active imide group, the alkali-soluble resin need to contain 10 mol % or more, preferably 20 mol % or more of latter monomer which can provide alkali solubility to the alkali-soluble resin. If the content of the monomer, which can provide alkali solubility to the alkali-soluble resin, is less than 10 mol %, alkali solubility is so insufficient that the development latitude is insufficient.

Examples of another components (another polymerizable monomer) which can be used for copolymerization and used in combination with the polymerizable monomer having a phenolic hydroxyl group, the polymerizable monomer having a sulfonamide group and/or the polymerizable monomer having an active imide group include monomers described in following items (m1) to (m12). However, these are not intended to limit the components.

(m1) acrylates and methacrylates each having an aliphatic hydroxyl group such as 2-hydroxyethyl acrylate and 2-hydroxyethyl methacrylate (m2) alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, N-dimethylaminoethyl acrylate and the like (m3) alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, N-dimethylaminoethyl methacrylate and the like (m4) acrylamides and methacrylamides such as acrylamides, methacrylamides, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide and the like (m5) vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether (m6) vinyl esters such as vinyl acetate, vinyl chloroacetate, vinyl butylate, vinyl benzoate and the like (m7) styrenes such as styrene, α-methylstyrene, methylstyrene, chloromethylstyrene and the like (m8) vinyl ketones such as methyl vinyl ketone, ethyl vinyl ketone, propyl vinyl ketone, phenyl vinyl ketone and the like (m9) olefins such as ethylene, propylene, isobutylene, butadiene, isoprene and the like (m10) N-vinylpyrrolidone, N-vinylcarbazole, 4-vinylpyridine, acrylonitrile, methacrylonitrile and the like (m11) unsaturated imides such as maleimide, N-acryloylacrylamide, N-acetylmethacrylamide, N-propionylmethacrylamide, N-(p-chlorobenzoyl)methacrylamide and the like (m12) unsaturated carboxylic acids such as acrylic acid, methacrylic acid, maleic anhydride, itaconic acid and the like In the present invention, when the alkali-soluble resin is a homopolymer or copolymer of the polymerizable monomer having a phenolic hydroxyl group, the polymerizable monomer having a sulfonamide group and/or the polymerizable monomer having an active imide group, it is preferable that the homopolymer or copolymer has a weight average molecular weight of 2,000 or more and a number average molecular weight of 500 or more. More preferably, the weight average molecular weight is in the range of from 5,000 to 300,000 and the number average molecular weight is in the range of from 800 to 250,000, and a degree of dispersion (weight average molecular weight/number average molecular weight) is preferably in the range of from 1.1 to 10. When the alkali-soluble resin is a phenol/formaldehyde resins, cresol/formaldehyde resins and the like, the weight average molecular weight of the resin is preferably in the range of from 500 to 20,000 and the number average molecular weight is preferably in the range of from 200 to 10,000.

These alkali-soluble resins may be used singly or in combinations of two or more and utilized in an amount of 30 to 99% by weight, preferably 40 to 95% by weight, more preferably 50 to 90% by weight of the total solid component of the recording layer. When the amount of the alkali-soluble resin is less than 30% by weight, the durability of the recording layer is deteriorated. When the amount of the resin exceeds 99% by weight, it is not preferable in both sensitivity and durability.

[(B) Infrared Absorbent]

Infrared absorbent used in the present invention is not limited, as long as the infrared absorbent is a material, which can generate heat upon absorbing IR. That is, known pigments or dyes which can generate heat upon absorbing IR can be used in the present invention.

Pigments suitable for use in the present invention are commercially available pigments and those described in "Color Index Handbook (C.I.)", "Latest Pigment Handbook" (Saishin Ganryo Binran) edited by Japan Association of Pigment Technologies (Nihon Ganryo Gijitsu Kyokai) (1977), "Latest Pigment Application Technologies" (Saishin Ganryo Osyo Gijutsu) CMC, 1986 and "Printing Ink Technologies" (Insatsu Inki Gijutsu), CMC, 1984.

Examples of the pigments include black pigments, yellow pigments, orange pigments, brown pigments, red pigments, purple pigments, blue pigments, green pigments, fluorescent pigments, metal powder pigments, and polymers containing chemically combined dyes. Concrete examples of the pigments are insoluble azo pigments, azo lake pigments, condensed azo pigments, chelated azo pigments, phthalocyanine-based pigments, anthraquinone-based pigments, perylene and perinone-nased pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments, and carbon black.

These pigments may be used without being surface-treated or may be used after being surface-treated. Possible surface treatments include a treatment in which a resin or a wax is coated on the surface of the pigments, a treatment in which a surfactant is adhered to the surface of the pigment, and a treatment in which a reactive substance (e.g., a silane coupling agent, an epoxy compound or a polyisocyanate) is bonded to the surface of the pigment. These surface-treating methods are described in "Properties and Applications of Metal Soaps" (Saiwai Shobo Co., Ltd.), "Printing Ink Technologies" (Insatsu Inki Gijutsu), CMC, 1984 and "Latest Pigment Application Technologies" (Saishin Ganryo Oyo Gijutsu), CMC, 1986.

The diameter of the pigments is preferably 0.01 $\mu$m to 10 $\mu$m, more preferably 0.05 $\mu$m to 1 $\mu$m, and most preferably 0.1 $\mu$m to 1 $\mu$m. If the diameter is less than 0.01 $\mu$m, the dispersion stability of the pigments in a coating liquid to form a photosensitive layer is insufficient, whereas, if the diameter is greater than 10 $\mu$m, the uniformity of the photosensitive layer after coating thereof is poor. A known dispersing technology using a dispersing machine employed in the preparation of ink and toners can also be used for the purpose of dispersing the pigments. Examples of the dispersing machine include an ultrasonic wave dispersing machine, a sand mill, an attritor, a pearl mill, a super mill, a ball mill, an impeller, a disperser, a KD mill, a colloid mill, a dynatron, a three-roller mill, and a pressurized kneader. Details of these dispersing technologies are described in "Latest Pigment Application Technologies" (Saishin Ganryo Oyo Gijutsu), CMC, 1986.

The dyes suitable for use in the present invention are commercially available dyes and those described in, for example, "Handbook of Dyes" edited by Association of Organic Synthesis (Yuki Gosei Kagaku Kyokai) (1970). Concrete examples of the dyes include azo dyes, azo dyes in the form of a metallic complex salt, pyrazolone azo dyes, anthraquinone dyes, phthalocyanine dyes, carbonium dyes, quinonimine dyes, methine dyes, and cyanine dyes. Among these pigments and dyes, the pigments or dyes which absorb infrared light or near-infrared light are particularly preferable in the present invention, because they are suitable to use in a laser emitting infrared light or near-infrared light.

A suitable pigments which absorbs infrared light or near-infrared light is carbon black. Concrete examples of dyes which absorb infrared light or near-infrared light include cyanine dyes described in, e.g., Japanese Patent Application Laid-Open (JP-A) Nos. 58-125246, 59-84356, 59-202829, and 60-78787, methine dyes described in, e.g., JP-A Nos. 58-173696, 58-181690, and 58-194595, naphthoquinone dyes described in, e.g., JP-A Nos. 58-112793, 58-224793, 59-48187, 59-73996, 60-52940 and 63-62744, squarylium dyes described in JP-A No. 58-112792 and cyanine dyes described in U.K. Patent No. 434,875.

Another suitable dye is the near-infrared absorbing sensitizer described in U.S. Pat. No. 5,156,938, and a substituted arylbenzo(thio)pyrylium salt described in U.S. Pat. No. 3,881,924, a trimethinethiapyrylium salt described in JP-A No. 57-142645 (U.S. Pat. No. 4,327,169), pyrylium-based compounds described in JP-A Nos. 58-181051, 58-220143, 59-41363, 59-84248, 59-84249, 59-146063 and 59-146061, a cyanine dye described in JP-A No. 59-216146, a pentamethinethiopyrylium salt described in U.S. Pat. No. 4,283,475, and pyrylium-based compounds described in Japanese Patent Application Publication (JP-B) Nos. 5-13514 and 5-19702, Epolight III-178, Epolight III-130, Epolight III-125 and the like manufactured by manufactured by Epolin Co., Ltd. are most preferably used.

Further examples of the preferred dyes are near-infrared-absorbing dyes represented by the formulas (I) and (II) in U.S. Pat. No. 4,756,993. The amounts of the dye and the pigment are each in the range of from 0.01 to 50% by weight and preferably in the range of from 0.1 to 10% by weight based on the total solid component of the material for a printing plate. Most preferably, the amount of the dye is in the range of from 0.5 to 10% by weight, while the amount added of the pigment is in the range of from 3.1 to 10% by weight based on the weight of the total solids of the material for a printing plate. If the amount of the pigment or the dye is less than 0.01% by weight, the sensitivity of the material for a printing plate may decrease, whereas, if the amount added is more than 50% by weight, the photosensitive layer becomes nonuniform and the durability of the recording layer is poor. The dye or the pigments may be added to the same layer together with other components, or otherwise the dye or the pigment may be added to a separate layer provided additionally. If the dye or the pigment is added to a separate layer, it is desirable that the layer to which the dye or the pigment is added is a layer adjacent to the layer containing a substance which is thermally degradable but capable of substantially decreasing the solubility of a binder when in an undegraded state. The dye or the pigment is added preferably to a layer containing a binder resin, but may be added to a separate layer.

[Other Components]

According to needs, a variety of additives may be incorporated into the positive photosensitive composition of the present invention. For example, from the standpoint of more effective inhibition of the dissolution of the image areas into a developing solution, it is desirable to incorporate a substance, such as an onium salt, an o-quinone diazide compound, an aromatic sulfone compound, or an aromatic sulfonate compound. These substances are thermally degradable but capable of substantially decreasing the solubility of a polymeric compound which is soluble in an aqueous alkaline solution, when these are in an undegraded state. Examples of the onium salts include diazonium salts, ammonium salts, phosphonium salts, iodonium salts, sulfonium salts, selenonium salts, and arsonium salts.

Suitable examples of the onium salts, which are used in the present invention, include diazonium salts described in S. I. Schlesinger, Photogr. Sci. Eng., 18,387 (1974), T. S. Bal et al., Polymer, 21,423 (1980), diazonium salts described in JP-A Nos. 5-158230 and the like, ammonium salts described in U.S. Pat. Nos. 4,069,055, 4,069,056, JP-A No. 3-140140 and the like, phosphonium salts described in D. C. Necker et al., Macromolecules, 17,2468 (1984), C. S. wen et al, Tech, Proc. Conf. Rad. Curing ASIA, p478, Tokyo, October (1988), U.S. Pat. Nos. 4,069,055, 4,069,056 and the like, iodonium salts described in J. V. Crivello et al., Macromolecules, 10 (6), 1307 (1977), Chem.& Eng. News, Nov. 28,p31 (1988), European Patent Application No. 104, 143, U.S. Pat. No. 4,837,124, JP-A Nos. 2-150848, 2-296514 and the like, sulfonium salts described in J. V. Crivello et al., Polymer J.17, 73 (1985), J. V. Crivello et al., J. Org. Chem., 43,3055 (1978), W. R. Watt et al., J. Polymer Sci., Polymer Chem. Ed., 22, 1789 (1984), J. V. Crivello et al., Polymer Bull. 14,279 (1985), J. V. Crivello et al., Macromorecules, 14 (5), 1141 (1981), J. V. Crivello et al., J. Polymer Sci., Polymer Chem. Ed., 17,2877 (1979), European Patent Application No. 370,693, 233,567, 297,443, 297,442, U.S. Pat. Nos. 3,902,114, 3,902,114, 410,201, 339,049, 4,760,013, 4,734,444, 2,833,827, DE Patent Nos. 2,904,626, 3,604,580, 3,604,581 and the like, selenonium salts described in J. V. Crivello et al., Macromolecules, 10 (6), 1307 (1977), J. V. Crivello et al., J. Polymer Sci., Polymer Chem. Ed., 17,1047 (1979) and the like, an arsonium salt and the like described in C. S. Wen et al., Tech, Proc. Conf. Rad. Curing ASIA, p478, Tokyo, October (1988) and the like.

Among the onium salts, diazonium salts are particularly preferable. In addition, more preferable diazonium salts are those described in JP-A No. 5-158230.

Examples of counter ions of the onium salts include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4, 6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxyl-4-hydroxy-5-benzoyl-benzenesulfonic acid, and p-toluenesulfonic acid. Among these acids, particularly suitable acids are alkyl-substituted aromatic sulfonic acids such as hexafluorophosphoric acid, triisopropylnaphthalenesulfonic acid and 2,5-dimethylbenzensulfonic acid.

O-quinone diazide compounds are preferable as the quinone diazide compounds. The o-quinone diazide compound for use in the present invention is a compound, which has at least one o-quinone diazide group, and increases the solubility in alkali when the compound thermally degrades. That is, the solubility of a photosensitive composition comprised in the plate is increased because (i) an ability of the o-quinone diazide to inhibit the dissolution of the binder is released by thermal decomposition of the o-quinone diazide and (ii) the o-quinone diazide itself is converted into an alkali-soluble substance by the thermal decomposition. Compounds having various structures can be used in the present invention. Examples of the o-quinone diazide compound for use in the present invention include the compounds described in J. Coarser, "Light-Sensitive Systems", pp.339–352, John Wiley & Sons, Inc. Among these compounds, particularly suitable compounds are sulfonates of o-quinone diazides and sulfonamides of o-quinone diazides obtained by reacting o-quinone diazides with aromatic polyhydroxy compounds or aromatic amino compounds. Also suitable are esters prepared by reacting benzoquinone-(1,2)-diazide-sulfonyl chloride or naphthoquinone-(1,2)-diazide-5-sulfonyl chloride with a pyrogallol/acetone resin as described in JP-B No. 43-28403 and esters prepared by reacting benzoquinone-(1,2)-diazide-sulfonyl chloride or naphthoquinone-(1,2)-diazide-5-sulfonyl chloride with a phenol/formaldehyde resin as described in U.S. Pat. Nos. 3,046,120 and 3,188,210.

In addition to these compounds, also suitable compounds are esters prepared by reacting naphthoquinone-(1,2)-diazide-4-sulfonyl chloride with a phenol/formaldehyde resin or a cresol/formaldehyde resin and esters prepared by reacting naphthoquinone-(1,2)-diazide-4-sulfonyl chloride with a pyrogallol/acetone resin. Other useful o-quinone diazide-based compounds are described in many patent documents. For example, these compounds are described in JP-A Nos. 47-5303, 48-63802, 48-63803, 48-96575, 49-38701, and 48-13354, JP-B Nos. 41-11222, 45-9610 and 49-17481, U.S. Pat. Nos. 2,797,213, 3,454,400, 3,544,323, 3,573,917, 3,674,495, and 3,785,825, U.K. Patent Nos. 1,227,602, 1,251,345, 1,267,005, 1,329,888, and 1,330,932, and German Patent No. 854,890.

The amount of the o-quinone diazide compound is in the range of from 1 to 50% by weight, more preferably in the range of from 5 to 30% by weight, and most preferably in the range of from 10 to 30% by weight based on the weight of the total solid materials for a printing plate. These compounds may be used singly or in combinations of two or more.

The amount of the additives other than o-quinone diazide compounds is in the range of from 1 to 50% by weight, more preferably in the range of from 5 to 30% by weight, and most preferably in the range of from 10 to 30% by weight based on the weight of the total solid materials for a printing plate. The additives and the binder are preferably contained in the same layer.

In addition to these additives, cyclic acid anhydrides, phenols, and organic acids can also be used in order to increase the sensitivity. Examples of the cyclic acid anhydrides include phthalic anhydride, tetrahydrophthalic anhydride, hexahydrophthalic anhydride, 3,6-endoxy-Δ4-tetrahydrophthalic anhydride, tetrachlorophthalic anhydride, maleic anhydride, chloromaleic anhydride, α-phenylmaleic anhydride, succinic anhydride, and pyromellitic anhydride as described in U.S. Pat. No. 4,115,128. Examples of the phenol include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane. Examples of the organic acid include sulfonic acids, sulfinic acids, alkylsulfuric acids, phosphonic acids, phosphates, and carboxylic acids as described in, e.g., JP-A Nos. 60-88942 and 2-96755. Concrete examples of these organic acids include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophtalic acid, adipic acid, p-toluic acid, 3,4-dimethyoxybenzoic acid, phthalic acid, terephthalic acid, 4-cyclohexene-1,2-dicarboxylic acid, erucic acid, lauric acid, n-undecanoic acid, and ascorbic acid. The amount added of the cyclic acid anhydride, the phenol, and the organic acid is in the range of from 0.05 to 20% by weight, more preferably in the range of from 0.1 to 15% by weight, and most preferably in the range of from 0.1 to 10% by weight based on the weight of the total solids of the material for a printing plate.

Further, in order to broaden the stable range of processing conditions, the coating solution for the printing plate of the present invention may be contained a nonionic surfactant as described in JP-A Nos. 62-251740 and 3-208514, an amphoteric surfactant as described in JP-A Nos. 59-121044 and 4-13149, siloxane based compound as described in EP 950517, and a copolymer of a fluorine containing monomer as described in JP-A No. 11-288093.

Concrete examples of the nonionic surfactant include sorbitan tristearate, sorbitan monopalmitate, sorbitan trioleate, stearic acid monoglyceride, and polyoxyethylene nonylphenyl ether. Concrete examples of the amphoteric surfactant include alkyldi(aminoethyl)glycine, hydrochloric acid salt of alkylpolyaminoethylglycine, 2-alkyl-N-carboxyethyl-N-hydroxyethylimidazolinium betaine, and N-tetradecyl-N, N-betaine (e.g., Amogen K manufactured by Dai-ichi Kogyo Seiyaku Co., Ltd.).

As a siloxane compound, a block copolymer of dimethylsiloxane and polyalkylene oxide is preferable and embodiments thereof include polyalkylene oxide-modified silicones such as DBE-224, DBE-621, DBE-712, DBE-732 and DBE-534 manufactured by Chisso K. K. and Tego Glide100 and the like manufactured by Tego Company in Germany.

The preferred amounts added of the nonionic surfactant and the amphoteric surfactant are each in the range of from 0.05 to 15% by weight, more preferably from 0.1 to 5% by weight, based on the total solids weight of the material for a printing plate.

In the present invention, the material for a printing plate may contain a dye or a pigment as a printing-out agent which makes it possible to produce a visible image immediately after heating caused by exposure and also as an image coloring agent.

A typical example of the printing-out agent is a combination of a compound, which releases an acid by heating caused by exposure (i.e., a photoacid releasing agent) and an organic dye capable of forming a salt with the foregoing compound. Concrete examples of the printing-out agent include a combination of o-naphthoquinonediazide-4-sulfonyl halogenide and an organic dye which forms a salt with this compound as described in JP-A Nos. 50-36209 and 53-8128 as well as a combination of a trihalomethyl compound and an organic dye which forms a slat with this compound as described in JP-A Nos. 53-36223, 54-74728, 60-3626, 61-143748, 61-151644, and 63-58440. Examples of the trihalomethyl compound are an oxazole-based compound and a triazine-based compound, both of which are effective in providing a good storability and a clear printed out image.

A dye other than the above-mentioned salt-forming organic dyes can also be used as an image coloring agent. Examples of suitable dyes include oil-soluble dyes and basic dyes in addition to the salt-forming organic dyes. Specific examples of these dyes include Oil Yellow No. 101, Oil Yellow No. 103, Oil Pink No. 312, Oil Green BG, Oil Blue BOS, Oil Blue No. 603, Oil Black BY, Oil Black BS, and Oil Black T-505 (all manufactured by Orient Chemical Industries, Co., Ltd.), Victoria Pure Blue, Crystal Violet (C.I. 42555), Methyl Violet (C.I. 42535), Ethyl Violet, Rhodamine B (C.I. 145170B), Malachite Green (C.I. 42000), and Methylene Blue (C.I. 52015). The dyes described in JP-A No. 62-293247 are particularly preferable. The amount added of the dye is in the range of from 0.01 to 10% by weight and more preferably in the range of from 0.1% to 3% by weight based on the weight of the total solid materials for a printing plate. In order to impart flexibility to the layer, a plasticizer is incorporated into the material for a printing plate of the present invention. Examples of the plasticizer include butyl phthalate, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and an oligomer or a polymer of acrylic acid or methacrylic acid.

The image recording layer of the present invention is usually formed by coating a coating liquid, which is prepared by dissolving the above-described components in a solvent, on an appropriate support.

Some illustrative nonlimiting examples of the solvent include ethylene dichioricte, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidofle, dixnethyl sulfoxide, sulfolane, γ-butyrolactone, and toluene. These solvents may be used singly or in a combination of two or more.

The concentration of the total components (total solids including additives) in the coating liquid is preferably in the range of from 1 to 50% by weight.

The coated amount (solids) after coating and drying on the support varies according to the applications, but the desirable amount is generally in the range of from 0.5 to 5.0 $g/m^2$ in the case of a photosensitive material for a printing plate.

The coating liquid can be applied by various methods. Examples of the methods include bar coating, rotational coating, spraying, curtain coating, dipping, air-knife coating, blade coating, and roll coating. When the coated amount decreases, the characteristics of the photosensitive layer becomes poor, although apparent sensitivity increases.

In order to improve the applicability, the coating liquid to form the photosensitive layer of the present invention may contain a surfactant. An example of this surfactant is a fluorine-containing surfactant described in JP-A No. 62-170950. The preferred amount added of the surfactant is in the range of from 0.01 to 1% by weight, more preferably from 0.05 to 0.5% by weight, based on the weight of the total material for a printing plate.

A recording layer of the planographic printing plate precursor of the present invention may consist of a monolayer or a multilayer. That is, a recording layer formed on a support may be a recording layer consisting of a single positive recording layer containing the (A) water-insoluble and alkali-soluble resin, the (B) infrared absorbent and the (C) organic quaternary ammonium salt, a recording layer consisting of two or more layers which comprise the recording layer comprising those materials and another layer(s) or the like. The constitution of a recording layer is arbitrary, and can be changed optionally in accordance with demand. For example, a recording layer may be a recording layer obtained by laminating two or more positive recording layers each containing the (A) water-insoluble and alkali-soluble resin, the (B) infrared absorbent and the (C) organic quaternary ammonium salt, a recording layer obtained by laminating the positive recording layer of the present invention with the known other recording layer, or a recording layer obtained by laminating the positive recording layer of the present invention with a layer which contains the (A) water-insoluble and alkali-soluble resin as a main component but does not contain an infrared absorbent and therefore not sensitive to an infrared laser.

When a recording layer has a structure of plural layers, it is preferable that the positive recording layer of the present invention, which comprises materials of (A) to (C), is provided as an uppermost layer from the viewpoint of better development latitude.

When a recording layer has the multilayer structure as described above, a coating amount for each layer can be appropriately selected depending on the desired properties. For example, in the case of two-layered structure, it is preferable that a coating amount of an upper layer is in the range of from 0.05 to 5 $g/cm^2$, and a coating amount of a lower layer is in the range of from 0.5 to 5 $g/cm^2$.

In the present invention, since the (C) organic quaternary ammonium salt functions as an alkali developer dissolution inhibitor for the (A) water-insoluble and alkali-soluble resin. Therefore, it is a preferable that the recording layer has the concentration gradient of the (C) organic quaternary ammonium salt such that a portion near a surface of the recording layer contains a large amount of the (C) organic quaternary ammonium salt and a deep portion of the recording layer contains a small amount of the salt. For example, two or more positive recording layers in accordance with the present invention can be formed on the support such that a large amount of the (C) organic quaternary ammonium salt as the dissolution inhibitor is incorporated in an upper layer, and a small amount of the (C) organic quaternary ammonium salt is incorporated in a lower portion of a recording layer.

When a positive recording layer in accordance with the present invention is provided as an upper layer on a general positive recording layer or a layer containing (A) a water-insoluble and alkali-soluble resin as a main component but having no infrared sensitivity, excellent latitude can be realized since the upper recording layer functions as a layer for inhibiting permeation of an alkali developer in an unexposed portion, even when any recording layer is provided at a lower position.

[Support]

A support which is used in the present invention is a dimensionally stable plate. Concrete examples of the support include paper, paper laminated with a plastic (such as polyethylene, polypropylene and polystyrene), plates of metals (such as aluminum, zinc and copper), plastic films (such as diacetylcellulose, triacetylcellulose, cellulose propionate, cellulose butyrate, cellulose butyrate acetate, cellulose nitrate, polyethylene terephthalate, polyethylene, polystyrene, polypropylene, polycarbonate, and polyvinyl acetal), and paper or plastic films laminated or vapor-deposited with the aforementioned metals.

Among these materials, a polyester film and an aluminum plate are preferable. An aluminum plate is particularly preferable, because it has a good dimension stability and is relatively economical. Examples of the aluminum plate include a pure aluminum plate and a plate of an aluminum alloy containing aluminum as a main component together with a trace of other elements. A further example of the support is a plastic film, which is laminated or vapor-deposited with aluminum. Examples of the other elements which may be contained in the aluminum alloy include silicon, iron, manganese, copper, magnesium, chromium, zinc, bismuth, nickel, and titanium. The total content of the other elements in the aluminum alloy is 10% by weight or less. Although the aluminum particularly desirable for use in the present invention is pure aluminum, the aluminum to be used in the present invention may contain a small amount of other elements, because limitations in purification technologies make the production of perfectly pure aluminum difficult.

Accordingly, the composition of the aluminum plate for use in the present invention is not particularly limited, and a conventionally known aluminum plate as a material may be used appropriately in the present invention. The thickness of the aluminum plate for use in the present invention is about 0.1 mm to 0.6 mm, preferably 0.15 mm to 0.4 mm, and most preferably 0.2 mm to 0.3 mm.

Prior to the surface-roughening of the aluminum plate, if necessary, a degreasing treatment is performed in order to remove any rolling oil from the surface of the aluminum plate by means of a surfactant, an organic solvent, an aqueous alkaline solution, or the like. The surface-roughening of the aluminum plate may be performed by a variety of methods. Examples of these methods include a method in which the surface is mechanically roughened, a method in which the surface is roughened by being electrochemically dissolved, and a method in which the surface is selectively dissolved in a chemical way. The mechanical methods may be conventionally known methods such as ball abrasion, brushing, blasting and buffing. Examples of the electrochemical methods include electrolysis of the aluminum plate in an electrolyte solution, such as a hydrochloric acid or a nitric acid, using an AC current or a DC current. A combination of a mechanical method and an electrochemical method is also possible as described in JP-A No. 54-63902. If necessary, the surface-roughened aluminum plate is then subjected to an alkali-etching treatment and a neutralizing treatment. After that, if desired, the aluminum plate is subjected to an anodizing treatment so as to increase the water retention and wear resistance of the surface. A variety of electrolytes capable of producing a porous oxide layer can be used as an electrolyte for the anodizing treatment of the aluminum plate. Generally, sulfuric acid, phosphoric acid, oxalic acid, chromic acid, or a mixture of these acids is used as the electrolyte. The concentration of the electrolyte may be determined appropriately depending on the type of the electrolyte.

Conditions for the anodizing vary depending on the types of electrolyte solutions employed and cannot be stipulated unqualifiedly. However, generally employed conditions are as follows: concentration of the electrolyte solution is 1 to 80% by weight; temperature of the solution is 5 to 70° C.; current density is 5 to 60 $A/dm^2$; voltage is 1 to 10V; and duration of the electrolysis is 10 seconds to 5 minutes. If the amount of the anodized layer is less than 1.0 $g/m^2$, the surface has poor printing durability and therefore the non-image areas of a resulting planographic printing plate are liable to form scratch marks, which collect printing ink in printing to produce so-called scratch smudge. If necessary, the aluminum support whose surface is anodized may be rendered hydrophilic by a surface treatment. Examples of this hydrophilic treatment used in the present invention include treating the surface with an aqueous solution of an alkali metal silicate (such as sodium silicate) as described in U.S. Pat. Nos. 2,714,066, 3,181,461, 3,280,734, and 3,902,734, in which the support is simply immersed or electrolytically treated in an aqueous solution of sodium silicate. Further examples are a treatment of the surface with an aqueous solution of potassium fluorozirconate as described in Japanese Patent Application Publication (JP-B) No. 36-22063 and a treatment of the surface with an aqueous solution of polyvinylsulfonic acid as described in U.S. Pat. Nos. 3,276,868, 4,153,461 and 4,689,272.

If necessary, a subbing layer may be formed between the foregoing layer and the support.

Various organic compounds may be used as components for the subbing layer. For example, an organic compound constituting the subbing layer is selected from the group consisting of carboxymethyl cellulose, dextrin, gum arabic, phosphonic acids having an amino group such as 2-aminoethylphosphonic acid, organic phosphonic acids which may have a substituent such as phenylphosphonic acid, naphthylphosphonic acid, alkylphosphonic acid, glycerophosphonic acid, methylenediphosphonic acid, and ethylenediphosphonic acid, organic phosphoric acids which may have a substituent such as phenyiphosphoric acid, naphthylphosphoric acid, alkylphosphoric acid, and glycerophosphoric acid, organic phosphinic acids which may have a substituent such as phenylphosphinic acid, naphthylphosphinic acid, alkylphosphinic acid, and glycerophosphinic acid, amino acids such as glycine and β-alanine, and hydrochloric acid salts of amines having a hydroxyl group such as hydrochloric acid salt of triethanolamine. These compounds may be used singly or may be used in a combination of two or more.

The organic subbing layer may be formed by any method described below. For example, the above-mentioned organic compound is dissolved in water, an organic solvent such as methanol, ethanol or methyl ethyl ketone, or a mixture thereof to prepare a coating solution, and thereafter, the coating solution is applied to an aluminum plate to provide a subbing layer which is then dried. Alternatively, the above-mentioned organic compound is dissolved in water, an organic solvent such as methanol, ethanol or methyl ethyl ketone, or a mixture thereof to prepare a coating solution, and thereafter an aluminum plate is immersed in the coating solution so that the organic compound is adsorbed on the surface of the aluminum plate to form a subbing layer which is then water-rinsed and dried. When the former method is employed, a solution containing 0.005 to 10% by weight of the organic compound can be applied by a variety of methods. When the latter method is employed, the parameters of the conditions are as follows: concentration of the solution is 0.01 to 20% by weight and preferably 0.05 to 5% by weight; immersion temperature is 20 to 90° C., and preferably 25 to 50° C.; and immersion time is 0.1 second to 20 minutes and preferably 2 seconds to 1 minute. The pH of the coating solution may be adjusted to from 1 to 12 by use of a base such as ammonia, triethylamine or potassium hydroxide or an acid such as hydrochloric acid or phosphoric acid. Further a yellow dye may be incorporated into the coating solution so as to improve the reproducibility of the surface characteristics of the image recording material.

The desirable coated amount of the organic subbing layer is in the range of from 2 to 200 $mg/m^2$ and preferably in the range of from 5 to 100 $mg/m^2$. If the coated amount is less than 2 $mg/m^2$, a sufficient printing durability may not be obtained. On the other hand, if the coated amount exceeds 200 $mg/m^2$l , the same undesirable result may occur.

The positive image recording material thus obtained usually undergoes image exposure and development processes.

Examples of the light source of active rays to be used for the image exposure include mercury lamps, metal halide lamps, xenon lamps, chemical lamps, and carbon arc lamps. Examples of radiation include electron beams, X-rays, ion beams, and far-infrared rays. Further, g-rays, i-rays, deep-UV rays, and high-density energy beams (laser beams) can also be used. Examples of the laser beams include helium/neon laser, argon laser, krypton laser, helium/cadmium laser, and Kr/F excimer laser. In the present invention, a light source emitting light in the wavelength range from near-infrared rays to far-infrared rays is preferable, and a solid-state laser or a semiconductor laser is particularly preferable.

A conventionally known aqueous alkaline solution can be used as a developing solution and also as a replenisher solution for the processing of the image recording material of the present invention. These include a so-called "silicate developing solution" using a silicate alkali and containing silicate dioxide and a "non-silicate developing solution" comprising a non-reducing sugar and a base and containing substantially no silicate dioxide. Herein, "substantially" means that the presence of unavoidable impurities and a minor amount of silicate dioxide as a side product is acceptable.

As an aqueous alkaline solution, solutions at pH 12.5 to 13.5 are preferable.

In a step of developing the image-forming material of the present invention, any of the aforementioned developing solutions may be applied. However, from the viewpoint of improvement in latitude in the development, it is preferable to use a non-silicate developing solution.

It is thought that "a non-silicate developing solution" containing a base and an organic compound which can provide buffer action as a main component and "a silicate developing solution" containing an inorganic compound as a main component have the different action on a sensitizing layer. The mechanism that the planographic printing plate precursor of the present invention shows excellent effects by a non-silicate developing solution is explained below. In an unexposed portion of the heat-sensitive layer of the planographic printing plate precursor of the present invention, an alkali-soluble resin and an inorganic quaternary ammonium salt both constituting the heat-sensitive layer and an organic compound salt which is contained in the developing solution form an interaction such as hydrogen bond. Thus, stronger dissolution inhibiting effects against the developing solution caused by the interaction are obtained, and excellent effects of the alkaline resistance property are also obtained even when a strong developing solution having high activity is utilized. Similarly, the damage of a scratch formed on the surface can be also prevented by the development inhibiting effects. On the other hand, at an exposed portion, the aforementioned interaction is hardly obtained and, even if the interaction is obtained, the dissolution inhibiting effects are small. Therefore, the sufficient solubility in a developing solution is exhibit in the exposed portion.

Further, in the case of a heat-sensitive layer for use with an infrared laser, in an exposed portion, release of the dissolution inhibiting activity is not sufficiently performed due to the heat diffusion to the support nearer to the support. That is, the solubility of the exposed portion nearer to the support becomes lower, as compared with an exposed portion nearer to the surface of the recording layer. Therefore, in particular, effects of the present invention are more remarkably obtained when the concentration of the alkali-soluble resin and the organic quaternary ammonium salt compound is heightened at a portion nearer to the surface of the heat-sensitive layer.

A developing solution which can be used in the present invention will be explained in detail below. First, "a silicate developing solution" will be explained. The aforementioned silicic alkali exhibits the alkaline properties when dissolved in water. Examples thereof include alkali-metal silicates such as sodium silicate, potassium silicate, lithium silicate and the like, and ammonium silicate and the like.

The silicate alkalis may be used singly or in combinations of two or more.

The adjustment of developability of the developing solution is possible by varying the ratio of silicon oxide $SiO^2$ to alkali metal oxide $M^2O$, each of which constitutes the silicate, and the concentration of the silicate in the solution. For example, the use of alkali metal silicates described in JP-A No. 54-62004 and JP-B No. 57-7427 is effective in the present invention.

Among the aqueous alkali solutions, a mixing ratio of the silicon oxide $SiO_2$ to an alkali oxide $M_2O$ ($SiO_2/M_2O$, molar ratio) is preferably 0.5 to 3.0, more preferably 1.0 to 2.0.

When the $SiO_2/M_2O$ is less than 0.5, since the alkali strength is becoming greater, there may arise a problem that an aluminum plate and the like widely used as a support for a planographic printing plate precursor are etched. When it exceeds 3.0, the developability may be reduced.

In addition, the concentration of silicate alkali in a developing solution is preferably 1 to 10% by weight, more preferably 3 to 8% by weight, most preferably 4 to 7% by weight relative to the weight of an aqueous alkali solution.

When the concentration is less than 1% by weight, the developability and the processing ability may be reduced. When it exceeds 10% by weight, the precipitates and crystals are easily produced and, further, a gel is easily formed upon neutralization at solution waste, leading to disorder of solution waste treatment.

Then, "a non-silicate developing solution" will be explained. This developing solution comprises a non-reducing sugar and a base as described above. Herein, a non-reducing sugar means sugars which have no reducing properties because they have no free aldehyde group or ketone group. The non-reducing sugars are classified into trehalose-type oligosaccharides in which reducing groups are bound each other, glycosides in which a reducing group of sugars and non-sugars are bound, and sugar alcohols obtained by reducing sugars by addition of hydrogen. In the present invention, any of them can be used appropriately.

Examples of the trehalose-type oligosaccharide include saccharose and trehalose. Examples of the glycoside include alkyl glycoside, phenol glycoside, mustard oil glycoside and the like.

Examples of the sugar alcohol include D,L-arabitol, ribitol, xylitol, D,L-sorbitol, D,L-annitol, D,L-iditol, D,L-talitol, zulicitol, allozulicitol and the like.

Further, maltitol obtained by hydrogenating disaccharides, reduced substances obtained by hydrogenating oligosaccharide (reduced millet jelly) and the like may be exemplified.

Among them, as a non-reducing sugar, sugar alcohol and saccharose are preferable. Inter alia, D-sorbitol, saccharose and reduced millet jelly are more preferable because they provide a buffer action at a suitable pH area.

These non-reducing sugars may be used singly or in combinations of two or more. The proportion of the non-reducing sugar in a developing solution is preferably 0.1 to 30% by weight, more preferably 1 to 20% by weight.

An alkaline material as a base may be appropriately selected from previously known ones and may be combined with silicic alkali or non-reducing sugar.

Examples of the alkaline substance include an inorganic alkaline substance such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate and potassium borate, ammonium borate, and potassium citrate, potassium tertiary citrate, sodium and sodium citrate.

In addition, an organic alkaline substance can also be used as the alkaline substance. Examples of the organic alkaline substance include monomethylamine, dimethylamine, trimethylamine, monoethylamine, diethylamine, triethylamine, monoisopropylamine, diisopropylamine, triisopropylanune, n-butylamine, monoethanolamine, diethanolamine, triethanolamine, monoisopropanolamine, diisopropanolamine, ethyleneimine, ethylenediamine, and pyridine.

These alkaline substances are used singly or in a combination of two or more.

Among them, sodium hydroxide and potassium hydroxide are preferable because pH adjustment can be performed in the wide pH region by adjusting an amount to be added to a non-reducing sugar.

In addition, sodium tertiary phosphate, potassium tertiary phosphate, sodium carbonate, potassium carbonate and the like are preferable because they themselves have the buffering activity.

In an automated developing machine, a conventionally employed replenishing system is known to be able to process a large amount of pre-sensitized plates without exchanging the developing solution in the tank for a long period of time by feeding the tank with an aqueous solution (a replenisher solution) having an alkali strength higher than that of the developing solution in the tank. This replenishing system is also suitable for use in the present invention. If necessary, the developing solution and the replenisher solution may contain a surfactant or an organic solvent for such purposes as increasing or decreasing developability, dispersing the sludge resulting from development, and increasing the hydrophilicity of the image areas of a printing plate.

Examples of preferred surfactants include anionic surfactants, cationic surfactants, nonionic surfactants, and amphoteric surfactants. Further, if necessary, the developing solution and the replenisher solution may contain a reducing agent such as hydroquinone, resorcinol, and a salt of inorganic acid, e.g., sodium or potassium sulfite and sodium or potassium hydrogensulfite, an organic carboxylic acid, a defoaming agent and an agent to convert hard water into soft water.

The printing plate after being processed with the developing solution and the replenisher solution described above is then subjected to a post-treatment such as a treatment with rinsing water containing a surfactant or the like, or a treatment with a desensitizing solution containing gum arabic or a starch derivative. A combination of these treatments may be employed as a post-treatment when the image recording material of the present invention is used as a printing plate.

Recently, for the purpose of rationalization and standardization of plate making operations, automated developing machines have become widely used in the plate making and printing industries. Generally, the automated developing machine is made up of a developing part and a post-treating part, each comprising a device for transferring a printing plate together with tanks filled with processing solutions and spraying devices, in which the printing plate after exposure travels horizontally so that it is processed with the processing solutions which are moved up by means of pumps and sprayed from nozzles. Further, according to a new process, a printing plate is immersed in processing tank filled with a processing solution by means of immersed guide rolls or the like. In the above-mentioned automated processing, the processing can be performed by supplying replenisher solutions to the processing solutions in accordance with processed volume and operational period of time. Further, a so-called single-use solution system, in which a printing plate is processed with a substantially unused processing solution, can also be employed in the present invention.

If unnecessary image areas (e.g., film edge marks of the original film) are found on a planographic printing plate which has been obtained by a procedure comprising image exposure, developing, water-washing and/or rinsing and/or gum coating, the unnecessary image areas may be erased. The erasure is preferably performed by a process comprising coating the unnecessary image areas with an erasing solution, leaving the coating to remain on the unnecessary image areas for a predetermined period of time and then removing the coating by washing with water as described in JP-B No. 2-13293. In addition to this process, also possible is a process comprising irradiating the unnecessary image areas with active rays guided by optical fiber and then developing as described in JP-A No. 59-174842.

A planographic printing plate thus obtained is coated with a desensitizing gum, if necessary, and can be used in a printing operation. However, if it is desired to impart a higher level of printing durability to the printing plate, the printing plate undergoes a burning treatment. If the printing plate undergoes the burning treatment, it is desirable to treat the printing plate with a surface-adjusting solution, which is described in, e.g., JP-B Nos. 61-2518 and 55-28062 and JP-A Nos. 62-31859 and 61-159655, prior to the burning treatment.

According to these treatments, the planographic printing plate is coated with a surface-adjusting solution by using sponge or absorbent cotton soaked with the solution; the planographic printing plate is immersed in a vat filled with a surface-adjusting solution; or the planographic printing plate is coated with a surface-adjusting solution by means of an automated coater. If the coated amount is homogenized by means of a squeegee device such as squeegee rollers after the coating, a better result is obtained.

The suitable coated amount of the surface-adjusting solution is generally in the range of from 0.03 to 0.8 $g/m^2$ (dry weight). The planographic printing plate after being coated with the surface-adjusting solution is dried and thereafter heated at a high temperature, if necessary, by means of a burning processor (e.g., Burning Processor BP-1300 manufactured by Fuji Film Co., Ltd.). The temperature and time vary depending on the kind of components constituting the image, but a desirable temperature and time are 180 to 300° C. and 1 to 20 minutes.

After the burning, if necessary, the planographic printing plate may be subjected to conventionally employed treatments such as water-rinsing and gum-coating. However, if the surface-adjusting solution contains a water-soluble polymeric compound or the like, a so-called desensitizing treatment such as gum-coating maybe omitted. The planographic printing plate thus prepared is mounted on an offset printing machine or the like arid is then used for printing a large number of sheets.

The second aspect of the present invention will be explained in detail below.

The planographic printing plate precursor of the present invention comprises at least two positive recording layers and either of recording layers contain an infrared-absorbing dye. A recording layer of the planographic printing plate precursor of the present invention will be explained.

Hereinafter, among at least two layers of the positive recording layer of the present invention, a layer provided nearest to the surface (exposed surface) is referred to as an upper recording layer, and all of layers provided nearer to a support than the upper recording layer are referred to as a lower recording layer.

(Upper Recording Layer)

A coated amount of the upper recording layer is in the range of 0.05 to 0.45 $g/m^2$, more preferably 0.08 to 0.40 $g/m^2$, most preferably 0.1 to 0.35 $g/m^2$. When three or more recording layers are formed, it is preferable that the uppermost layer is in the range of 0.05 to 0.45 $g/m^2$. That is, the positive recording layer having a coating amount of 0.05 to 0.45 $g/m^2$ is located at a position nearest to a surface among a plurality of positive recording layers. When the coated amount of the upper recording layer is less than 0. 05 $g/m^2$, the heat produced by imagewise exposure is diffused and absorbed in the lower recording layer, which results in decrease in the sensitivity. In addition, there is a tendency in that the film strength at an image—forming area (unexposed portion) decreases. When the coated amount of the upper recording layer exceeds 0.45 g $m^2$, the sensitivity is lowered. The reason is that it is necessary to elevate a temperature of a whole upper recording layer when an image is formed. Further, an image portion is easily influenced of a scratch formed on the surface, and there is a tendency that the chemical resistance is lowered at printing, and these are not preferable.

The upper recording layer contains a water-insoluble and alkali-soluble resin and an infrared-absorbing dye.

As the infrared-absorbing dye contained in the upper recording layer, any known infrared-absorbing dyes can be selected and used, as long as they absorb infrared-ray such as a ray of an infrared laser, and produce the heat. However, from a viewpoint of unpreferable block of exposure to the lower recording layer, a pigment which does not have light transmittance such as carbon black is not preferable, and a dye having the high infrared transmittance is preferable. Examples of the preferable infrared-absorbing dyes include an indoaniline dye, a cyanine dye, a merocyanine dye, an oxonol dye, a porphyrin derivative, an anthraquinone dye, a merostyryl dye, a pyrylium compound, a diphenyl and triphenyl azo compound, a squarylium derivative and the like.

These dyes can be added to the upper recording layer in an amount of 0.01 to 50% by weight, preferably 0.5 to 30% by weight, particularly 1 to 20% by weight based on all solids components of the upper recording layer. When an amount of a dye to be added is less than 0.1% by weight, the sensitivity is lowered, while when the amount exceeds 50% by weight, the uniformity of the recording layer is lost, the durability is lowered and, at the same time, the transmittance of an exposure to the lower recording layer is lowered and the sensitivity is lowered.

In the second aspect of the present invention, the (A) water-insoluble and alkali-soluble resin described in the first aspect can be used as the water-insoluble and alkali-soluble polymer compound (hereinafter, conveniently, referred to as alkali-soluble polymer) which is used in the recording layer of the second aspect. Further, the homopolymer containing an acidic group on a main chain and/or a side chain in a polymer, the copolymer thereof and the mixture thereof of the first aspect are also used. Therefore, a polymer layer of the second aspect of the present invention has the properties that it is dissolved when it is contacted with an alkaline developing solution.

Among them, those having an acidic group shown in the following (1) to (6) on a main chain and/or a side chain in a polymer are preferable from a viewpoint of the solubility in an alkaline developing solution. (1) Phenolic hydroxy group (—Ar—OH) (2) Sulfonamide group (—$SO_2$NH—R) (3) Substituted sulfonamide type acid group (hereinafter, referred to as "active imide group") (—$SO_2$NHCOR, —$SO_2$NH$SO_2$R, —-CONH$SO_2$R) (4) Carboxylic group (—$CO_2$H) (5) Sulfonic group (—$SO_3$H) (6) Phosphoric group (—$OPO_3H_2$)

In the acidic groups of (1) to (6), Ar represents a divalent aryl linking group optionally having a substituent, and R represents a hydrocarbon group optionally having a substituent.

Among alkali-soluble polymers having an acidic group selected from the (1) to (6), alkali-soluble polymers having (1) a phenolic hydroxy group, (2) a sulfonamide group and (3) an active imide group are preferable. In particular, alkali-soluble polymers having (1) a phenolic hydroxy group or (2) a sulfonamide group are most preferable from the viewpoint of sufficient solubility in an alkaline developing solution and film strength.

Next, a representative example of a polymerizable component for the alkali-soluble polymer compound will be described.

(1) Polymerizable Monomer having a Phenolic Hydroxy Group

Examples of a polymerizable monomer having a phenolic hydroxy group include polymerizable monomers which is a low-molecular compound having one or more of phenolic hydroxy groups and one or more polymerizable unsaturated bonds, such as acrylamide, methacrylamide, acrylic ester, methacrylic ester and hydroxystyrene.

More particularly, examples thereof include polymerizable monomers having a phenolic hydroxy group described in the first aspect of the present invention.

(2) Polymerizable Monomer having a Sulfonamide Group

Examples of a polymerizable monomer having a sulfonamide group include polymerizable monomers which is a low-molecular compound having in one molecule one or more of sulfonamide groups (—NH—$SO_2$—) in which at least one hydrogen atom is bound to a nitrogen atom, and one or more polymerizable unsaturated bonds. Examples thereof include low-molecular compounds having an acryloyl group, an allyl group or a vinyloxy group, and a substituted or mono-substituted aminosulfonyl group or a substituted sulfonylimino group. Such the compounds include, for example, compounds represented by the general formulas (I) to (V) described in JP-A 8-123029.

Concrete examples of the polymerizable monomer having a sulfonamide group include m-aminosulfonylphenyl methacrylate, N-(p-aminosulfonylphenyl)methacrylamide, N-(p-aminosulfonylphenyl)acrylamide and the like. The polymerizable monomers having a sulfonamide group described in the first aspect are also utilized.

(3) Polymerizable Monomer having an Active Imide Group

As the polymerizable monomer having an active imide group, those having in a molecule an active imide group described in JP-A 11-84657 are preferable. Examples thereof include polymerizable monomers, which are low compounds having in one molecule one or more active imide groups and one or more polymerizable unsaturated bonds.

As the polymerizable monomer having an active imide group, N-(p-toluenesulfonyl)methacrylamide, N-(p-toluenesulfonyl)acrylamide and the like can be suitably used. The polymerizable monomers having an active imide group described in the first aspect can be also utilized.

(4) Alkali-soluble Polymer having a Carboxylic Group

As the alkali-soluble polymer having a carboxylic group, for example, there are polymers having, as a main component, a minimum constitution unit derived from a compound having one or more carboxylic groups and one or more polymerizable unsaturated groups.

(5) the Alkali-soluble Polymer having a Sulfonic Group

As the alkali-soluble polymer having a sulfonic group, for example, there are polymers having, as a main constitution unit, a minimum constitution unit derived from a compound having one or more sulfonic groups and one or more polymerizable in unsaturated groups in a molecule.

(6) Alkali-soluble Polymer having a Phosphoric Group

As the alkali-soluble polymer having a phosphoric group, for example, there are polymers having, as a main component, a minimum constituent unit derived from a compound having each one or more of phosphoric groups and of polymerizable unsaturated groups in a molecule.

A minimum constitution unit having an acidic group selected from the (1) to (6), which forms an alkali-soluble polymer used in the positive planographic printing plate material of the second aspect of the present invention, is not necessarily to limit to one kind, but a unit obtained by copolymerization of two or more of minimum constituent units having the same acidic group, or two or more minimum constituent unit having the different acidic groups.

As a method for copolymerization, the previously known graft copolymerizing method, block copolymerizing method, random copolymerizing method and the like can be used.

The aforementioned copolymer preferably contains at least one compound having an acidic group selected from (1) to (6), in an amount of 10 mole % or more, more preferably 20 mole % or more in a copolymer. When the amount of the compound is less than 10 mole %, there is a tendency that the development latitude can not be sufficiently improved.

In the present invention, a copolymer may comprise a compound other than compound containing acidic group of the aforementioned (1) to (6). Examples of other compound containing no acidic group of (1) to (6) include monomers shown in the (m1) to (m12) in the first aspect, but not limited thereto.

As an alkali-soluble polymer compound, polymer compound having a phenolic hydroxy group is preferable, since the image forming properties upon exposure with infrared laser are excellent. For example, polymer compounds having a phenolic hydroxy group of the first aspect there are preferable.

As a method of copolymerization for obtaining an alkali-soluble polymer compound, previously known methods such as graft copolymerizing method, block copolymerizing method, random copolymerizing method and the like can be used.

It is preferable that an alkali-soluble polymer compound has a weight average molecular weight of 500 or more, more preferably 1,000 to 700,000. In addition, it is preferable that its number average molecular weight is 500 or more, more preferable 750 to 600,000. A degree of dispersion (weight average molecular weight/number average molecular weight) is preferably 1.1 to 10.

Alkali-soluble polymer compound may be used singly or in combination of two kind or more. The total content is preferably 1 to 90% by weight, more preferably 2 to 70% by weight, more preferably 2 to 50% by weight of the total solid component of the upper recording layer. When the content is less than 1% by weight, the durability tends to be deteriorated. On the other hand, when the content exceeds 90% by weight, the sensitivity and the image forming properties tend to be lowered, and these are not preferable.

(Lower Recording Layer)

Among at least two layers of the positive recording layer of the second aspect, a lower recording layer provided near to a support will be explained below.

The lower recording layer contains a water-insoluble and alkali-soluble resin and an infrared-absorbing dye. As the water-insoluble and alkali-soluble resin contained in the lower recording layer, the same resins as those described above for the upper recording layer can be used. When an upper recording layer and a lower recording layer are provided adjacent to each other, the effects of the present invention may is decreased due to unclear boundary caused by mix or blend at a boundary portion between an upper recording layer and a lower recording layer. Therefore, in order to suppress the decrease of the effects, it is preferable that an alkali-soluble polymer used in the lower recording layer and an alkali-soluble polymer used in the upper recording layer are each having different solubility in a coating solvent. It is preferable that the lower recording layer is not dissolved in a coating solution of the upper recording layer. That is, a water-insoluble and alkali-soluble resin used in a lower recording layer and a water-insoluble and alkali-soluble resin used in an upper recording layer can have different solubilities in a coating solvent.

The alkali-soluble polymer compound may be used singly or in combination of two or more. The total content of the polymer compounds is preferably 1 to 90% by weight, more preferably 2 to 70% by weight, more preferably 2 to 50% by weight of the total solid component of the lower recording layer as in the upper recording layer.

In the second aspect of the present invention, an infrared-absorbing dye used in the lower recording layer is not particularly limited as long as it is a substance, which produces the heat by absorbing infrared light. In addition to infrared-absorbing dyes exemplified as suitable for the upper recording layer, other infrared-absorbing dyes can be used. Also in the lower recording layer, a pigment such as carbon black is not preferable from a viewpoint of coating properties. It is preferable to use an infrared-absorbing dye as a material having the light-heat converting function.

As a dye used in the layer, substances exemplified as a dye in the first aspect can be also used and preferable.

An amount of these dyes to be added is preferably in an amount of 0.01 to 50% by weight, more preferably 0.1 to 30% by weight, more 0.5 to 20% by weight, of total solid components in the lower recording layer.

When an amount of a dye to be added is less than 0.01% by weight, the sensitivity is lowered. On the other hand, when the amount exceeds 50% by weight, the uniformity of a sensitive layer is lost and the durability of a recording layer is deteriorated.

A coated amount of the lower recording layer is not particularly limited but can be selected in accordance with the use thereof, desirable sensitivity and recording properties. In the case of a planographic printing plate, generally, the amount is preferably in the range of 0.5 to 5.0 g/$m^2$, more preferably 0.5 to 1.9 g/$m^2$.

[Other Components]

For forming the aforementioned positive recording layers (upper recording layer, lower recording layer), in addition to the above essential components, a variety of additives can be added, if necessary, so long as the effects of the present invention are not impaired. As an example, substances exemplified in the first aspect of the present invention can be used. In addition, preferable ones are also preferable.

Each of the upper recording layer and the lower recording layer of the planographic printing plate precursor of the present invention can be manufactured by coating a solution for the lower recording layer on a suitable support and, then, coating a coating solution for the upper recording layer thereon. In addition, two or more recording layers may be coated together by using a prescribed apparatus (overlap-coating two recording layers).

As a solvent used for coating, the solvents used for dissolving components in order to form the recording layer in the first aspect are also exemplified and used for the second aspect. Preferable examples of the first aspect are also preferable, but it is not limited thereto.

When the upper recording layer and the lower recording layer are provided adjacent to each other, it is preferable that a solvent of the coating solution for the upper recording layer, which does not substantially dissolve a lower recording layer, is selected, in order to prevent mix of the layers at an interface thereof.

The concentration of the aforementioned component (all solids including additives) in a solvent is preferably in an amount of 1 to 50% by weight.

As a coating method, a variety of methods described in the first aspect can be used. Further, preferable examples and amounts of materials described in the first aspect are also preferable.

[Support]

As a support used in the second aspect of the present invention, a plate having the dimensional stability, with the necessary strength and the durability is exemplified. Supports mentioned in the first aspect can be used. Preferable examples of the first aspect are also preferable.

The planographic printing plate precursor of the second aspect of the present invention comprises at least two positive recording layers on a support. As necessary, a subbing layer may be provided between the support and the lower recording layer. The subbing layer described in the first aspect can be used. Preferable examples of the first aspect are also preferable.

The planographic printing plate precursor of the second aspect of the present invention may comprise any known layer such as an overcoat layer, an intermediate layer and a backcoat layer, in addition to the aforementioned recording layers, the subbing layer or the like, as long as the effects of the present invention are not impaired.

The positive planographic printing plate precursor is usually treated with image exposure and development.

As the light sources for active light used in image exposure, the light source having an emitting wavelength at near-infrared to infrared region is preferable, and a solid laser and a semiconductor laser are preferable. An emitting wavelength of 760 to 850 mm is preferable.

As a developing solution and a replenishing solution for a planographic printing plate of the second aspect of the present invention, the previously known aqueous alkali solution can be used.

Developing solutions and replenishing solutions described for the first aspect are similarly exemplified, and preferable examples and amounts described in the first aspect are also preferable. The printing plate precursor of the second aspect can be subjected to exposure, development and other treatments in the same manner as those described for the first aspect.

For example, there are inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, lithium hydroxide and the like. In addition, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine are used. These alkali agents are used singly or in combinations of two or more.

Among them, as a developing solution and a replenishing solution used for developing the planographic printing plate precursor of the present invention, the previously known alkali developing solution containing a base compound and an organic which can provide a buffing action as a main component and containing substantially no silicon dioxide is preferably used. In the present invention, such the developing solution is referred to as "non-silicate developing solution" hereinafter. Here, "substantially" means that the presence of a unavoidable impurities and minor silicon dioxide as a side product is acceptable.

By using the planographic printing plate precursor of the first aspect or the second aspect of the present invention, and by applying aforementioned non-silicate developing solution to a step of developing the planographic printing plate precursor, an excellent planographic printing plate having the improved scratch generation-inhibiting effects and having no defective image portion can be obtained. An aqueous alkali solution having pH 12.5 to 13.5 is preferable.

"Non-silicate developing solution" used in a method of making a plate of the present invention contains a base compound and an organic compound which can provide buffer action as a main component, as described above. As the organic compound having the buffering activity, there are sugars (in particular, those represented by the general formula (I) or (II)), oximes (in particular, those represented by the general formula (III)), phenols (in particular, those represented by the general formula (IV)) and fluorinated alcohols (in particular, those represented by the general formula (V)) which are described as a compound providing a buffer action in JP-A-8-220775. Among the compounds represented by the general formulas (I) to (V), preferable compounds are sugars represented by the general formula (I) or (II) and phenols represented by the general formula (V). Among sugars represented by the general formula (I) or (II), more preferable compounds are non-reducing sugars such as saccharose and the like and sulfosalicylic acid. The non-reducing sugar included trehalose type oligosaccharides in which reducing groups are bind with each other, glycosides which is obtained such that a reducing group of sugars is bound with a non-sugar, and sugar alcohols in which sugars are hydrogenated and reduced.

As examples of non-reducing sugars such as aforementioned trehalose-type oligosaccharides and the aforementioned sugar alcohols, those described in the first aspect can be exemplified and used. Preferable examples, amounts and the like described in the first aspects are also preferable.

The aforementioned organic compound providing a buffer action can be used in combination with an alkali substance (agent) as abase by appropriately selecting from the previously known alkali agents. As the alkali substance, those described in the first aspect can be exemplified and used. Preferable examples, amounts and the like of the first aspect are also preferable.

EXAMPLES

The first aspect of the present invention will be explained below, however the scope of the present invention is not limited to these Examples.

[Preparation of a Support]

An aluminum plate (material: 1050) having a thickness of 0.3 mm was degreased by washing with trichloroethylene, the surface thereof was grained using a nylon brush and a 400 mesh pumice-water suspension, and washed well with water. This plate was immersed in a 25% aqueous sodium hydroxide solution at 45° C. for 9 seconds to etch it. The plate was washed with water, and further immersed in a 20% nitric acid for 20 seconds, and washed with water. An etching amount of the grained surface was about 3 $g/m^2$. Then, 3 $g/m^2$ direct current anodized film was provided on this plate by using 7% sulfuric acid as an electrolysis solution at the current density of 15 $A/dm^2$. Subsequently, the plate was washed with water, dried, further treated with an aqueous solution of 2.5% by weight of sodium silicate at 30° C. for 10 seconds. And then, following subbing solution was coated on the plate, and the formed film was dried at 80° C. for 15 seconds to obtain a support. An amount of the formed film after drying was 15 $mg/m^2$.

[Subbing solution]

| | |
|---|---|
| The following compound | 0.3 g |
| Methanol | 100 g |
| Water | 1 g |

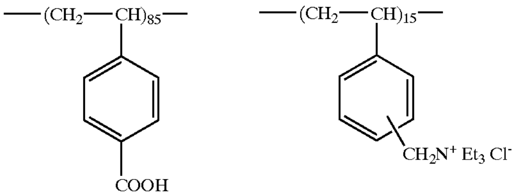

Molecular weight 2,8000

Example 1

The support was coated with a following sensitizing solution 1 at a coated amount of 1.0 $g/m^2$, and dried at 140° C. for 50 seconds to obtain a planographic printing plate precursor 1. "PERFECT OVEN PH200" manufactured by TABAI was used for the drying and a Wind Control thereof is set to 7.

[Sensitizing solution 1]

| | |
|---|---|
| Ammonium salt (1) | 0.04 g |
| m,p-cresol novolac (m/p ratio = 6/4, weight average molecular weight 3500, containing 0.5% by weight of unreacted cresol) | 0.474 g |
| A specific copolymer 1 described in JP-A No. 11-288093 | 2.37 g |
| Cyanine dye A (having a structure below) | 0.155 g |
| 2-methoxy-4-(N-phenylamino)benzene diazonium hexafluorophosphate | 0.03 g |
| Tetrahydrophthalic anhydride | 0.19 g |
| Ethyl violet in which a counterion thereof is changed to 6-hydroxy-β-naphthalenesulfonic acid | 0.05 g |

-continued

| [Sensitizing solution 1] | |
|---|---|
| Fluorine containing surfactant (Megafac F 176PF, manufactured by Dainihoninki Kagaku Kogyo K. K.) | 0.035 g |
| Fluorine containing surfactant (Megafac MCF-312, manufactured by Dainihoninki Kagaku Kogyo K. K.) | 0.05 g |
| Paratoluene sulfonic acid | 0.008 g |
| Bis-p-hydroxyphenylsulfone | 0.063 g |
| Dodecyl stearate | 0.06 g |
| γ-butyrolactone | 13 g |
| Methyl ethyl ketone | 24 g |
| 1-methoxy-2-propanol | 11 g |

Cyanine dye A

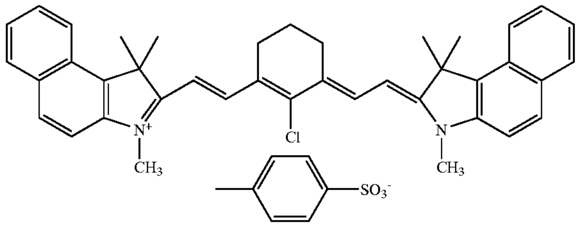

Example 2

The support was coated with a following sensitizing solution 2 at a coated amount of 1.6 g/$m^2$, and dried under the same conditions of Example 1, to obtain a planographic printing plate precursor 2.

| [Sensitizing solution 2] | |
|---|---|
| Ammonium salt (1) | 0.025 g |
| m,p-cresol novolac (m/p ratio = 6/4, weight average molecular weight 5000, containing 0.5% by weight of unreacted cresol) | 2.25 g |
| Cyanine dye A | 0.105 g |
| 2-methoxy-4-(N-phenylamino)benzene diazonium hexafluorophosphate | 0.03 g |
| Tetrahydrophthalic anhydride | 0.10 g |
| Ethyl violet in which a counter ion thereof is changed to 6-hydroxy-β-naphthalenesulfonic acid | 0.063 g |
| Fluorine containing surfactant (Megafac F 176PF, manufactured by Dainihoninki Kagaku Kogyo K. K. | 0.035 g |
| Fluorine containing surfactant (Megafac MCF-312, manufactured by Dainihoninki Kagaku Kogyo K. K.) | 0.13 g |
| Bis-p-hydroxyphenylsulfone | 0.08 g |
| Methyl ethyl ketone | 16 g |
| 1-methoxy-2-propanol | 10 g |

Example 3

The support was coated with a following sensitizing solution 3-A such that a coated amount after drying thereof is 0.85 g/$m^2$, and dried at 140° C. for 50 seconds. Subsequently, the obtained plate was coated with a sensitizing solution 3-B at a coated amount after drying of 0.15 g/$m^2$, and dried at 120° C. for 60 seconds to obtain a planographic printing plate precursor 3. The PERFECT OVEN PH200 manufactured by TABAI was used for the drying and a Wind Control thereof is set to 7.

| [Sensitizing solution 3-A] | |
|---|---|
| m,p-cresol novolac (m/p ratio = 6/4, weight average molecular weight 5000, containing 0.5% by weight of unreacted cresol) | 0.237 g |
| A specific copolymer described in JP-A 11-288093 | 2.37 g |
| Cyanine dye A | 0.10 g |
| 2-methoxy-4-(N-phenylamino)benzene diazonium hexafluorophosphate | 0.01 g |
| Tetrahydrophthalic anhydride | 0.19 g |
| Ethyl violet in which a counter ion thereof is changed to 6-hydroxy-β-naphthalenesulfonic acid | 0.05 g |
| Fluorine containing surfactant (Megafac F 176PF, manufactured by Dainihoninki Kagaku Kogyo K. K. | 0.035 g |
| Fluorine containing surfactant (Megafac MCF-312, manufactured by Dainihoninki Kagaku Kogyo K. K.) | 0.05 g |
| P-toluenesulfonic acid | 0.008 g |
| Bis-p-hydroxyphenylsulfone | 0.06 g |
| γ-butyrolactone | 13 g |
| Methyl ethyl ketone | 24 g |
| 1-methoxy-2-propanol | 11 g |
| **[Sensitizing solution 3-B]** | |
| Ammonium salt (1) | 0.1 g |
| m,p-cresol novolac (m/p ratio = 6/4, weight average molecular weight 5000, containing 0.5% by weight of unreacted cresol) | 0.237 g |
| Cyanine dye A | 0.025 g |
| 2-methoxy-4-(N-phenylamino)benzene diazonium hexafluorophosphate | 0.01 g |
| Fluorine containing surfactant (Megafac F 176PF, manufactured by Dainihoninki Kagaku Kogyo K. K. | 0.035 g |
| Fluorine containing surfactant (Megafac MCF-312, manufactured by Dainihoninki Kagaku Kogyo K. K.) | 0.05 g |
| Bis-p-hydroxyphenylsulfone | 0.003 g |
| Dodecyl stearate | 0.03 g |
| Methyl ethyl ketone | 15 g |
| 1-methoxy-2-propanol | 8 g |

Example 4

The support was coated with a following sensitizing solution 3-A such that a coated amount after drying is 0.85 g/$m^2$, and dried at 140° C. for 50 seconds. Subsequently, the obtained plate was coated with a sensitizing solution 4 at a coated amount after drying of 0.15 g/$m^2$, and dried at 120° C. for 60 seconds to obtain a planographic printing plate precursor 4. The PERFECT OVEN PH200 manufactured by TABAI was used for the drying and a Wind Control thereof is set to 7.

| [Sensitizing Solution 4] | |
|---|---|
| Amonium salt (1) | 0.35 g |
| m,p-cresol novolac (m/p ratio = 6/4, weight average molecular weight 5000, containing 0.5% by weight of unreacted cresol) | 0.237 g |
| Cyanine dye A | 0.025 g |
| 2-methoxy-4-(N-phenylamino)benzene diazonium hexafluorophosphate | 0.01 g |
| Fluorine containing surfactant (Megafac F 176PF, manufactured by Dainihoninki Kagaku Kogyo K. K. | 0.035 g |
| Fluorine containing surfactant (Megafac MCF-312, manufactured by Dainihoninki Kagaku Kogyo K. K.) | 0.05 g |
| Bis-p-hydroxyphenylsulfone | 0.003 g |
| Dodecyl stearate | 0.03 g |
| Methyl ethyl ketone | 15 g |
| 1-methoxy-2-propanol | 8 g |

Example 5

The support was coated with a following sensitizing solution 3-A such that a coated amount after drying is 0.85 g/m$^2$, and dried at 140° C. for 50 seconds. Subsequently, the plate was coated with a sensitizing solution 5 at a coated amount after drying of 0.15 g/m$^2$, and dried at 120° C. for 60 seconds to obtain a planographic printing plate precursor 5. The PERFECT OVEN PH200 manufactured by TABAI was used for the drying and a Wind Control thereof is set to 7.

| [Sensitizing Solution 5] | |
|---|---|
| Ammonium salt (2) | 0.017 g |
| m,p-cresol novolac (m/p ratio = 6/4, weight average molecular weight 5000, containing 0.5% by weight of unreacted cresol) | 0.237 g |
| Cyanine dye A | 0.025 g |
| 2-methoxy-4-(N-phenylamino)benzene diazonium hexafluorophosphate | 0.01 g |
| Fluorine containing surfactant (Megafac F 176PF, manufactured by Dainihoninki Kagaku Kogyo K. K. | 0.035 g |
| Fluorine containing surfactant (Megafac MCF-312, manufactured by Dainihoninki Kagaku Kogyo K. K.) | 0.05 g |
| Bis-p-hydroxyphenylsulfone | 0.003 g |
| Dodecyl stearate | 0.03 g |
| Methyl ethyl ketone | 15 g |
| 1-methoxy-2-propanol | 8 g |

Examples 6 to 14

Planographic printing plate precursors 6 to 14 were prepared in the same manner as the planographic printing plate precursor 4, except that ammonium salts shown in the following Table 1 were used instead of the ammonium salt (1) in the sensitizing solution 4 of the Example 4.

TABLE 1

| | Organic quaternary ammonium salt |
|---|---|
| Planographic printing plate precursor 6 | Ammonium salt (3) |
| Planographic printing plate precursor 7 | Ammonium salt (4) |
| Planographic printing plate precursor 8 | Ammonium salt (2) |
| Planographic printing plate precursor 9 | Ammonium salt (5) |
| Planographic printing plate precursor 10 | Ammonium salt (6) |
| Planographic printing plate precursor 11 | Ammonium salt (7) |
| Planographic printing plate precursor 12 | Ammonium salt (8) |
| Planographic printing plate precursor 13 | Ammonium salt (9) |
| Planographic printing plate precursor 14 | Ammonium salt (10) |

Examples 15 to 17

Planographic printing plate precursors 15 to 17 were prepared in the same manner as the planographic printing plate precursor 4 except that the sensitizing solution 1 is used, and an ammonium salt shown in the following Table 2 was used instead of the ammonium salt (1) in the sensitizing solution 1 of the Example 1.

TABLE 2

| | Organic quaternary ammonium salt |
|---|---|
| Planographic printing plate precursor 15 | tetramethylammonium bromide |
| Planographic printing plate precursor 16 | tetraethylammonium bromide |
| Planographic printing plate precursor 17 | tetrapropylammonium bromide |

Comparative Example 1

A planographic printing plate precursor 18 was prepared in the same manner as Example 1, except that the ammonium salt (1) was not added in the sensitizing solution 1 of Example 1.

Comparative Example 2

A planographic printing plate precursor 19 was prepared in the same manner as Example 2, except that the ammonium salt (1) was not added in the sensitizing solution 2 of Example 2.

Comparative Example 3

A planographic printing plate precursor 20 was prepared in the same manner as Example 3, except that the ammonium salt (1) was not added in the sensitizing solution 3-B in Example 3.

[Evaluation of a Planographic Printing Plate Precursor]

[Scratch Resistance Test (1)]

The resulting planographic printing plate precursors 1 to 14 of the present invention and planographic printing plate precursors 15 to 17 of Comparative Examples were rubbed 30 times with an abraser felt CS 5 under 250 g load using a rotary abrasion tester manufactured by TOYOSEIKI.

Thereafter, a developing solution DT-1 or DP-4 manufactured by Fuji Film Co., Ltd. (diluted 1:8 with tap water) was placed in a PS processor 900H manufactured by Fuji Film Co., Ltd., and developments of the precursors were performed at a temperature of 30° C. for a development time of 12 seconds. As a gum solution, FP-2W (diluted 1:1 with tap water) was used.

A developing solution DT-1 is a so-called non-silicate developing solution, and DP-4 is a silicate-containing developing solution.

Evaluation of the scratch (blemish or scar) resistance property was performed under the following criteria. The results are shown in Table 3 below. Usually, no problem on the scratch resistance property (scratch resistance ability) under the criteria satisfies the practical performance.

○: The optical density of a rubbed portion of a photosensitive film was not changed as compared with those of a non-rubbed portion.

X: The optical density of a rubbed portion of a photosensitive film was considerably reduced as compared with those of a non-rubbed portion.

[Scratch Resistance Test (2)]

A scratching scratch was provided on the planographic printing plate precursors with a successively loading-type scratching strength tester TYPE-HEIDON-18 (manufactured by Shinto Kagaku K.K.) wherein a diamond needle (R=0.4 mm) is utilized, scratching rate is 50 mm/sec and a load applied was varied.

Thereafter, a developing solution DT-1 or DP-4 manufactured by Fuji Film Co., Ltd. (diluted 1:8 with tap water) was placed in a PS processor 900H manufactured by Fuji Film Co., Ltd., and development of the precursors was performed at a solution temperature of 30° C. and a developing time of 12 seconds. As a gum solution, FP-2W (diluted 1:1 with tap water) was used. The plate after development was evaluated with naked eyes, and a maximum load (g) giving no scratch was adopted as the scratching scratch strength. The results are shown in Table 3 below.

Usually, the maximum load of 5 g or greater is a level of no practical problem and the maximum load of 10 g or greater is extremely excellent in the scratch resistance property. A plate having the maximum load can stand the excess severe handling.

[Development Latitude Evaluation (1)]

A test pattern image was formed on the resulting planographic printing plate precursors 1 to 17 of the present invention and the planographic printing plate precursors 18 to 20 of Comparative Examples with an infrared laser at the beam strength of 9 w and a drum rotating rate of 150 rpm with a Trendsetter manufactured by Creo Products Inc.

Thereafter, a developing solution DT-1 or DT-4 manufactured by Fuji Film Co., Ltd. (diluted 1:8 with tap water) was placed in a PS processor 900H manufactured by Fuji Film Co., Ltd., and development was performed at a solution temperature of 30° C. and a development time of 12 seconds. As a gum solution, FP-2W (diluted 1:1 with tap water) is used. All planographic plates obtained under this condition show excellent developability at an exposed portion.

Next, assuming a condition under which a developer was concentrated, above developing solution was changed to a developing solution which was prepared by diluting in a dilution ratio of 1:7 with tap water. An exposed planographic printing plate was developed similarly at a solution temperature of 30° C. and a development time of 12 seconds. Usually, no problem of the developability under this condition satisfies the practical performance.

The decrease in the optical density at an unexposed portion of the recording layer in the planographic printing plate after development was evaluated with naked eyes and, whereby, the image forming properties when a concentrated developer was utilized were evaluated under the following criteria. The results are shown in Table 3 below.

No observation of the decrease of the density indicates that an image portion was not dissolved out as compared with those of a developing solution having the higher activity and, thus, latitude to the activity of a developing solution was large.

○: The decrease of the density was not observed

X: The decrease of the density was observed

TABLE 3

| | | Developing solution | Scratch resistance test (1) | Scratch resistance test (2) | Evaluation of development latitude (1) |
|---|---|---|---|---|---|
| Example 1 | Planographic printing plate precursor 1 | DT-1 | ○ | 10 g | ○ |
| | Planographic printing plate precursor 1 | DP-4 | ○ | 5 g | ○ |
| Example 2 | Planographic printing plate precursor 2 | DT-1 | ○ | 10 g | ○ |
| Example 3 | Planographic printing plate precursor 3 | DT-1 | ○ | 20 g | ○ |
| Example 4 | Planographic printing plate precursor 4 | DT-1 | ○ | 15 g | ○ |
| Example 5 | Planographic printing plate precursor 5 | DT-1 | ○ | 10 g | ○ |
| | Planographic printing plate precursor 5 | DP-4 | ○ | 5 g | ○ |
| Example 6 | Planographic printing plate precursor 6 | DT-1 | ○ | 15 g | ○ |
| Example 7 | Planographic printing plate precursor 7 | DT-1 | ○ | 15 g | ○ |
| Example 8 | Planographic printing plate precursor 8 | DT-1 | ○ | 20 g | ○ |
| Example 9 | Planographic printing plate precursor 9 | DT-1 | ○ | 20 g | ○ |
| Example 10 | Planographic printing plate precursor 10 | DT-1 | ○ | 15 g | ○ |
| Example 11 | Planographic printing plate precursor 11 | DT-1 | ○ | 15 g | ○ |
| Example 12 | Planographic printing plate precursor 12 | DT-1 | ○ | 5 g | ○ |
| Example 13 | Planographic printing plate precursor 13 | DT-1 | ○ | 5 g | ○ |
| Example 14 | Planographic printing plate precursor 14 | DT-1 | ○ | 5 g | ○ |
| Example 15 | Planographic printing plate precursor 15 | DT-1 | ○ | 5 g | ○ |
| Example 16 | Planographic printing plate precursor 16 | DT-1 | ○ | 5 g | ○ |
| Example 17 | Planographic printing plate precursor 17 | DT-1 | ○ | 5 g | ○ |

TABLE 3-continued

| | | Developing solution | Scratch resistance test (1) | Scratch resistance test (2) | Evaluation of development latitude (1) |
|---|---|---|---|---|---|
| Comparative Example 1 | Planographic printing plate precursor 18 | DP-4 | X | less than 5 g | X |
| Comparative Example 2 | Planographic printing plate precursor 19 | DT-1 | X | less than 5 g | X |
| Comparative Example 3 | Planographic printing plate precursor 20 | DT-1 | X | less than 5 g | X |

As shown in Table 3, the planographic printing plate precursors of the present invention are excellent in the scratch resistance property as compared with those of Comparative Examples. Further, in the planographic printing plate precursors of the present invention, the decrease of the density of an image portion was not observed even when the developing solution of high concentration was used and, thus, the excellent development latitude is obtained.

[Evaluation of Development Latitude (2)]

Assuming a condition under which a developing solution is more concentrated, the similar evaluation was carried out.

A test pattern image was formed on the planographic printing plate precursors 1 to 14 of the present invention and the planographic printing plate precursors 15 to 17 of Comparative Examples with an infrared laser at the beam strength 9 w and a drum rotating rate of 150 rpm with Trendsetter manufactured by Creo Products Inc.

Next, a developing solution DT-1 or DP-4 manufactured by Fuji Film Co., Ltd. (diluted 1:6 with tap water) was placed in a PS processor 900H manufactured by Fuji Film Co., Ltd., and development was performed at a solution temperature of 30° C. and a development time of 12 seconds.

As described above, the decrease in the optical density at an unexposed portion of the recording layer in the planographic printing plate after development was evaluated with naked eyes, and the image formation property when developing solution of higher concentration was utilized was determined under the following criteria. The results are shown in Table 4 below. Table 4 describes also the results of the development latitude evaluation (1).

When the decrease in the concentration was not observed, it indicates that an image part was not dissolved out in a developer having the higher activity and, thus, latitude is extremely wide with respect to the activity of the developer.

○: The decrease of the density was not observed.

Δ: Slight decrease of the concentration perceivable with naked eyes was observed.

X: Apparent decrease in the concentration was observed.

TABLE 4

| | | Developing solution | Evaluation of development latitude (2) | Evaluation of development latitude (1) |
|---|---|---|---|---|
| Example 1 | Planographic printing plate precursor 1 | DT-1 | ○ | ○ |
| | Planographic printing plate precursor 1 | DP-4 | Δ | ○ |
| Example 2 | Planographic printing plate precursor 2 | DT-1 | Δ | ○ |
| Example 3 | Planographic printing plate precursor 3 | DT-1 | ○ | ○ |
| Example 4 | Planographic printing plate precursor 4 | DT-1 | ○ | ○ |
| Example 5 | Planographic printing plate precursor 5 | DT-1 | ○ | ○ |
| | Planographic printing plate precursor 5 | DP-4 | Δ | ○ |
| Example 6 | Planographic printing plate precursor 6 | DT-1 | ○ | ○ |
| Example 7 | Planographic printing plate precursor 7 | DT-1 | ○ | ○ |
| Example 8 | Planographic printing plate precursor 8 | DT-1 | ○ | ○ |
| Example 9 | Planographic printing plate precursor 9 | DT-1 | ○ | ○ |
| Example 10 | Planographic printing plate precursor 10 | DT-1 | ○ | ○ |
| Example 11 | Planographic printing plate precursor 11 | DT-1 | ○ | ○ |
| Example 12 | Planographic printing plate precursor 12 | DT-1 | Δ | ○ |
| Example 13 | Planographic printing plate precursor 13 | DT-1 | Δ | ○ |
| Example 14 | Planographic printing plate precursor 14 | DT-1 | Δ | ○ |

TABLE 4-continued

| | | Developing solution | Evaluation of development latitude (2) | Evaluation of development latitude (1) |
|---|---|---|---|---|
| Example 15 | Planographic printing plate precursor 15 | DT-1 | Δ | ○ |
| Example 16 | Planographic printing plate precursor 16 | DT-1 | Δ | ○ |
| Example 17 | Planographic printing plate precursor 17 | DT-1 | Δ | ○ |
| Comparative Example 1 | Planographic printing plate precursor 18 | DP-4 | X | X |
| Comparative Example 2 | Planographic printing plate precursor 19 | DT-1 | X | X |
| Comparative Example 3 | Planographic printing plate precursor 20 | DT-1 | X | X |

As apparent from Table 4 and the Table 3, the planographic printing plate precursor of the present invention has the remarkable effect in both scratch resistance property and development latitude, particularly when a non-silicate developing solution was used for development. In addition, among the precursors, a planographic printing plate precursor comprising a recording layer which contains an organic quaternary ammonium salt having an aryl group or a carbonyl group and a planographic printing plate precursor having a recording layer of the multilayer structure and an upper layer thereof were found to provide excellent effects.

According to the first aspect of the present invention, there can be provided an positive planographic printing plate precursor for use with an infrared laser which is used for a direct plate and which has an excellent latitude at the time of development for forming an image and has the excellent scratch resistance property.

The second aspect of the present invention will be explained by referring Examples below, but the scope of the present invention is not limited to the Examples.

[Preparation of a Support]

A support was prepared in a same way as Examples of the first aspect.

Examples 18 to 20

Comparative Example 4

The support was coated with a following coating solution of a lower recording layer at an amount described in Table 1 below (g/$m^2$), and dried at 140° C. for 50 seconds. Thereafter, a coating solution of an upper recording layer was coated at an amount (g/$m^2$) described in Table 5 below, and dried at 120° C. for 1 minute, to obtain planographic printing plate precursors 21 to 23 of Examples and the planographic printing plate precursor 24 of Comparative Example. A PERFECT OVEN PH200 manufactured by TABAI is used for the drying and a Wind Control thereof is set to 7.

| [Coating solution for a lower recording layer] | |
|---|---|
| N-(4-aminosulfonylphenyl)methacrylamide/ acrylonitrile/methyl methacrylate (36/34/30: weight average molecular weigh 50,000) | 1.896 g |
| Cresol novolak (m/p = 6/4 weight average-molecular weight 4500, remaining monomer 0.8 wt %) | 0.237 g |
| Cyanine dye A (having the aforementioned structure) | 0.109 g |
| 4,4'-bishydroxyphenylsulfone | 0.063 g |
| Tetrahydrophthalic anhydride | 0.190 g |
| p-toluene sulfonic acid | 0.008 g |
| Ethyl violet in which a counter ion thereof is changed to 6-hydroxy-β-naphthalenesulfonic acid | 0.05 g |
| Fluorine containing surfactant (Megafac F176, manufactured by Dainihon Inki Kogyo (K. K.)) | 0.035 g |
| Methyl ethyl ketone | 26.6 g |
| 1-methoxy-2-propanol | 13.6 g |
| γ-butyrolactone | 13.8 g |
| [Coating solution for an upper recording layer] | |
| m,p-cresol novolac (m/p ratio = 6/4, weight average molecular weight 4500, containing 0.8% by weight of unreacted cresol) | 0.237 g |
| Cyanine dye A (having the above structure) | 0.047 g |
| Dodecyl stearate | 0.060 g |
| 3-methoxy-4-diazodiphenylamine hexafluorophosphate | 0.030 g |
| Fluorine containing surfactant (Megafac F176, manufactured by Dainihon Inki Kagaku Kogyo (K. K.)) | 0.110 g |
| Fluorine containing surfactant (Megafac MCF-312 (30%), manufactured by Dainihon Inki Kogyo (K. K.)) | 0.120 g |
| Methyl ethyl ketone | 15.1 g |
| 1-methoxy-2-propanol | 7.7 g |

TABLE 5

| | Planographic printing plate precursor | Coated amount (g/$m^2$) Upper recording layer | Coated amount (g/$m^2$) lower recording layer | Infrared absorbent Upper recording layer | Infrared absorbent lower recording layer | Load at perceivable scratch (g) | Sensitivity (mJ/$cm^2$) | Electric conductivity of developing solution for image forming (mS/cm) | Resistance to chemicals (*10,000) |
|---|---|---|---|---|---|---|---|---|---|
| Example 18 | 21 | 0.27 | 0.85 | Presence | Presence | 75 | 67 | 43–51 | 30 |
| Example 19 | 22 | 0.08 | 1.10 | Presence | Presence | 50 | 42 | 41–49 | 35 |

TABLE 5-continued

| | Planographic printing plate precursor | Coated amount (g/m$^2$) Upper recording layer | lower recording layer | Infrared absorbent Upper recording layer | lower recording layer | Load at perceivable scratch (g) | Sensitivity (mJ/cm$^2$) | Electric conductivity of developing solution for image forming (mS/cm) | Resistance to chemicals (*10,000) |
|---|---|---|---|---|---|---|---|---|---|
| Example 20 | 23 | 0.40 | 0.65 | Presence | Presence | 120 | 75 | 45–55 | 25 |
| Comparative Example 4 | 24 | 0.55 | 0.83 | Presence | Presence | 135 | 130 | 52–75 | 5 |
| Comparative Example 5 | 25 | 0.28 | 0.83 | Absence | Presence | 80 | 100 | 57–75 | 8 |
| Comparative Example 6 | 26 | 0.28 | 0.80 | Presence | Absence | 3 | 67 | 43–45 | 6 |

Comparative Example 5

A planographic printing plate precursor 25 was prepared in the same manner as Example 18, except that a cyanine dye A which is an infrared-absorbing dye was not added in a coating solution for an upper recording layer.

Comparative Example 6

A planographic printing plate precursor 26 was prepared in the same manner as Example 18, except that a cyanine dye A which is an infrared-absorbing dye was not added in a coating solution for a lower recording layer.

[Evaluation of a Planographic Printing Plate Precursor]

[Scratch Resistance Test]

A scratching scratch was provided on the planographic printing plate precursors 21 to 23 of the present invention and the planographic printing plate precursors 24 to 26 of Comparative Examples by applying a load to a diamond (0.4 mm) using a scratching tester manufactured by HEIDON. Thereafter, the plate was developed with a developing solution (DT-1) (diluted to have an electric conductivity 45 mS/cm) manufactured by Fuji Film Co., Ltd., and a load at which a scratch was perceived was determined and shown in Table 5. The greater value shows excellent scratch resistance property.

A developing solution (DT-1) contains sorbitol as a main component, and is a non-silicate developing solution.

The results of the scratch resistance property evaluation are shown in Table 5.

As shown in Table 5, the planographic printing plate precursor of the present invention and the planographic printing plate precursor of Comparative Example 1 have excellent scratch resistance property.

[Evaluation of Sensitivity]

A test pattern image was formed on the planographic printing plate precursors 21 to 23 of the present invention and the planographic printing plate precursors 24 to 26 of Comparative Examples by varying the exposure energy with Trendsetter manufactured by Creo Products Inc. Thereafter, the plate was developed with a developing solution DT-1 manufactured by Fuji Film Co., Ltd. (diluted to have an electric conductivity 45 mS/cm). Minimum value of the exposure energy at which an exposed portion can be developed with this developing solution was measured, and the value indicates the sensitivity. The smaller value is evaluated to have higher sensitive. The results are shown in Table 5.

[Evaluation of Development Latitude]

A test pattern image was formed on the planographic printing plate precursors 21 to 23 of the present invention and the planographic printing plate precursors 24 to 26 of Comparative Examples at the beam strength 9 w and a drum rotating rate of 150 rpm with Trendsetter manufactured by Creo Products Inc.

The planographic printing plate precursors 21 to 26 which had been exposed under the above conditions were developed at a solution temperature of 30° C. for a developing time of 12 seconds using a PS processor 900 H manufactured by Fuji Film Co., Ltd. Dilution ratio of a developing solution DT-1 manufactured by Fuji Film Co., Ltd. was varied and used for the evaluation. Stain and coloration resulting from insufficiently development and remaining recording layer film was sought on the surface of the plates. A developing solution by which better development could be performed and the stain and coloration were not caused was determined. The electric conductivity of the developing solution was measured. The results were shown in Table 5. A great difference between an upper limit and a lower limit was evaluated to be excellent in development latitude.

[Evaluation of Chemical Resistance]

The planographic printing plates on which an image had been formed in the same manner as the above sensitivity evaluation were used to print an image with a printing machine Lisron manufactured by Komori Corporation (K.K.). Printing was successively performed while wiping the plate surface with a cleaner (CL-2 manufactured by Fuji Film Co., Ltd.) every 10,000 sheets printing. Ink concentration of the prints was measured with naked eyes, and the number of sheets, which can satisfy a sufficient ink concentration, was determined. A large number of the sheets are evaluated to have excellent chemical resistance. The results are shown in Table 5.

As shown from Table 1, all of the planographic printing plate precursors of the present invention have an excellent scratch resistance property and high sensitivity. Further, these planographic printing plate precursors have an excellent development latitude and excellent chemical resistance.

On the other hand, the planographic printing plate precursor of Comparative Example 4 in which an upper recording layer is too thick and the planographic printing plate precursor of the Comparative Example 5 in which an upper recording layer does not contain an infrared-absorbing dye have poor sensitivity. Further, the planographic printing plate precursor of Comparative Example 6 in which a lower recording layer does not contain an infrared-absorbing dye easily damaged by scratch, has the narrow development latitude and, thus, it is not suitable for practical use.

As described above, since the planographic printing plate precursor of the second aspect of the present invention is excellent in the sensitivity at image formation and development latitude, excellent image can be formed effectively at the low energy, defects resulting from a scratch at an image portion can be inhibited. Further, since a printed image obtained from planographic printing plate is hardly influenced by fine scratches on the surface of the plate, the handling properties are better. Furthermore, vain steps such as reexposure of a plate can be omitted, and it is suitable for practical use.

According to the second aspect of the present invention, there can be obtained a positive planographic printing plate precursor for use with an infrared laser for direct plate making, wherein a recording layer thereof have an excellent sensitivity and development latitude when an image is formed, and the recording layer can suppress an occurrence of defects resulting from a scratch of an image portion, and which can form the better image.

What is claimed is:

1. A positive planographic printing plate precursor, comprising a support having disposed thereon a positive recording layer containing (A) a water-insoluble and alkali-soluble resin, (B) an infrared absorbent and (C) an organic quaternary ammonium salt, wherein solubility of the recording layer in an aqueous alkali solution is increased by exposure to an infrared laser.

2. The positive planographic printing plate precursor according to claim 1, wherein the (C) organic quaternary ammonium salt has in a molecule thereof at least one of an aryl group and a carbonyl group.

3. The positive planographic printing plate precursor according to claim 1, wherein the (C) organic quaternary ammonium salt has in a molecule thereof both an aryl group and a carbonyl group.

4. The positive planographic printing plate precursor according to claim 1, wherein the (C) organic quaternary ammonium salt is represented by the following general formula (I):

General formula (I)

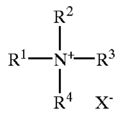

wherein $R^1$, $R^2$, $R^3$ and $R^4$ are each independently an organic group having one or more carbon atoms, and they may be bonded with each other to form a ring.

5. The positive planographic printing plate precursor according to claim 4, wherein at least one of $R^1$, $R^2$, $R^3$ and $R^4$ is selected from the group consisting of the following structures:

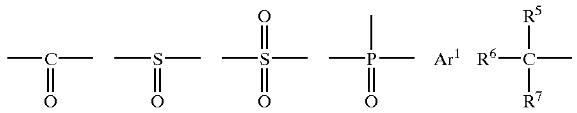

wherein $Ar^1$ represents an aryl group, $R^5$, $R^6$ and $R^7$ represent independently a hydrogen atom or an organic group having one or more carbon atoms, at least two of which are selected from an organic group which is not a hydrogen atom, and $R^5$, $R^6$ and $R^7$ may be bonded with each other to form a ring.

6. The positive planographic printing plate precursor according to claim 4, wherein at least one of $R^1$, $R^2$, $R^3$ and $R^4$ is selected from the group consisting of the following structures:

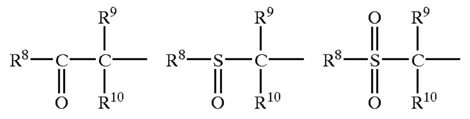

wherein $R^8$, $R^9$ and $R^{10}$ represent independently a hydrogen atom or an organic group having one or more carbon atoms, at least two of which are selected from an organic group which is not a hydrogen atom, and $R^8$, $R^9$ and $R^{10}$ may be bonded with each other to form a ring.

7. The positive planographic printing plate precursor according to claim 6, wherein $R^8$ is an aryl group.

8. The positive planographic printing plate precursor according to claim 4, wherein at least one of $R^1$, $R^2$, $R^3$ and $R^4$ is selected from the group consisting of the following structures:

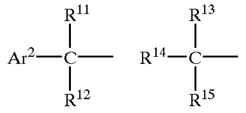

wherein $Ar^2$ represents an aryl group, $R^{11}$ and $R^{12}$ represent independently a hydrogen atom or an organic group having one or more carbon atoms, $Ar^2$, $R^{11}$ and $R^{12}$ may be bonded with each other to form a ring, and $R^{13}$, $R^{14}$ and $R^{15}$ represent independently a hydrogen atom or an organic group having one or more carbon atoms, at least one of $R^{13}$, $R^{14}$ and $R^{15}$ is a non-aromatic cyclic substituent, or any adjacent two of $R^{13}$, $R^{14}$ arid $R^{15}$ may be bonded with each other to form a ring.

9. The positive planographic printing plate precursor according to claim 4, wherein the (C) organic quaternary ammonium salt represented by the general formula (I) is at least one selected from the group consisting of the following ammonium salts:

Ammonium salt (1)

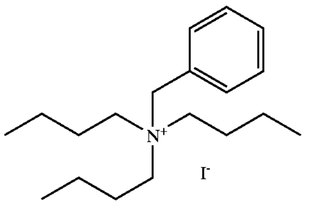

Ammonium salt (2)

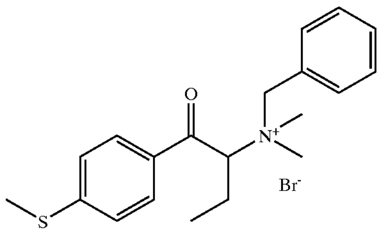

Ammonium salt (3)

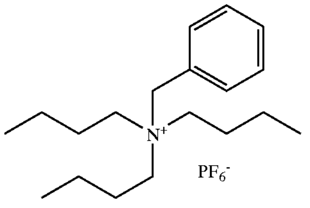

-continued

Ammonium salt (4)

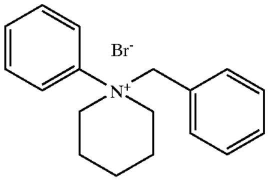

Ammonium salt (5)

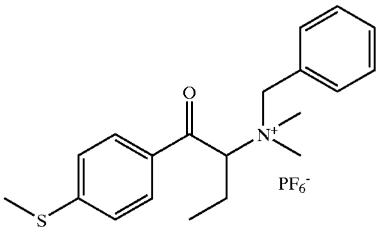

Ammonium salt (6)

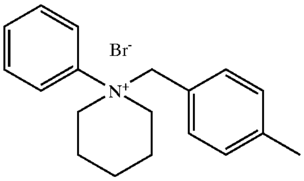

Ammonium salt (7)

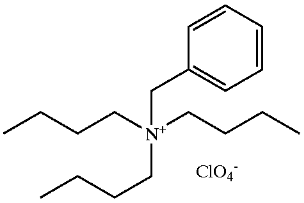

Ammonium salt (8)

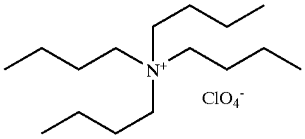

Ammonium salt (9)

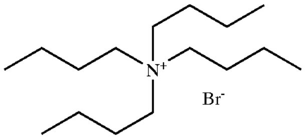

Ammonium salt (10)

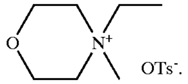

10. The positive planographic printing plate precursor according to claim 1, wherein the (C) organic quaternary ammonium salt is contained at 0.1 to 40% by weight of the total solid component of the positive recording layer.

11. A positive planographic printing plate precursor, comprising a support having disposed thereon at least two positive recording layers containing a water-insoluble and an alkali-soluble resin and an infrared-absorbing dye, with solubility of the recording layer in an aqueous alkali solution being increased by exposure to an infrared laser, wherein a coating amount of an upper positive recording layer is in the range of 0.05 to 0.45 g/m$^2$ and wherein a water-insoluble and alkali-soluble resin used in a lower recording layer and a water-insoluble and alkali-soluble resin used in the upper recording layer have different solubilities in a coating solvent.

12. The positive planographic printing plate precursor according to claim 11, wherein the positive recording layer having a coating amount of 0.05 to 0.45 g/m$^2$ is located at a position nearest to a surface among a plurality of positive recording layers.

13. The positive planographic printing plate precursor according to claim 11, wherein an infrared-absorbing dye contained in an upper positive recording layer has high infrared transmittance.

14. The positive planographic printing plate precursor according to claim 13, wherein the dye having the high infrared transmittance is at least one selected from the group consisting of an indoaniline dye, a cyanine dye, a merocyanine, an oxonol dye, a porphyrin derivative, an anthraquinone dye, a merostyryl dye, a pyrylium compound, a diphenyl and triphenyl azo compound and a squarylium derivative.

15. The positive planographic printing plate precursor according to claim 11, wherein the water-insoluble and alkali-soluble polymer compound is selected from the group consisting of a homopolymer containing an acidic group on a main chain and/or a side chain, a copolymer thereof and a mixture thereof, and the acidic group which is at least one of a phenol group and a sulfonamide group.

16. The positive planographic printing plate precursor according to claim 11, wherein two or more kinds of water-insoluble and alkali-soluble resins are used in combination as the water-insoluble and an alkali-soluble resin.

17. The positive planographic printing plate precursor according to claim 11, wherein the recording layer further contains at least one selected from the group consisting of an onium salt, an o-quinonediazide compound, an aromatic sulfone compound, an aromatic sulfonic ester compound, a nonionic surfactant, an amphoteric surfactant, a printing out agent, an plasticizer and a dye and a pigment as an image coloring agent.

18. The positive planographic printing plate precursor according to claim 11, wherein each of an upper recording layer and a lower recording layer is prepared by a process selected from: a process comprising the steps of coating the lower recording layer coating solution on the support and coating an upper recording layer coating solution thereon; and a process of overlap-coating two recording layers.

19. The positive planographic printing plate precursor according to claim 11, wherein the support is one of a polyester film and an aluminum plate.

* * * * *